United States Patent
Ohnuma et al.

(10) Patent No.: US 8,034,694 B2
(45) Date of Patent: Oct. 11, 2011

(54) SOI SUBSTRATE, METHOD FOR MANUFACTURING THE SAME, AND SEMICONDUCTOR DEVICE

(75) Inventors: Hideto Ohnuma, Atsugi (JP); Tetsuya Kakehata, Isehara (JP); Yoichi Iikubo, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 664 days.

(21) Appl. No.: 12/073,741

(22) Filed: Mar. 10, 2008

(65) Prior Publication Data
US 2008/0246109 A1    Oct. 9, 2008

(30) Foreign Application Priority Data
Apr. 3, 2007    (JP) ................. 2007-097892

(51) Int. Cl.
*H01L 21/30* (2006.01)
*H01L 21/46* (2006.01)
*H01L 21/322* (2006.01)

(52) U.S. Cl. ........ 438/458; 438/459; 438/474; 438/475; 257/E21.12; 257/E21.563; 257/E21.568

(58) Field of Classification Search .................. 438/458, 438/459, 474, 475; 257/E21.12, E21.563, 257/E21.568
See application file for complete search history.

(56) References Cited

U.S. PATENT DOCUMENTS

| | | | |
|---|---|---|---|
| 5,374,564 A | 12/1994 | Bruel | |
| 6,013,563 A * | 1/2000 | Henley et al. | 438/458 |
| 6,127,702 A | 10/2000 | Yamazaki et al. | |
| 6,242,320 B1 | 6/2001 | So | |
| 6,271,101 B1 | 8/2001 | Fukunaga | |
| 6,312,797 B1 | 11/2001 | Yokokawa et al. | |
| 6,335,231 B1 | 1/2002 | Yamazaki et al. | |

(Continued)

FOREIGN PATENT DOCUMENTS

FR    2911430    7/2008

(Continued)

OTHER PUBLICATIONS

Lu et al., Ion-cutting of Si onto glass by pulsed and direct-current plasma immersion ion implantation, Sep. 15, 2003, pp. 2109-2113.*

(Continued)

*Primary Examiner* — Alexander Ghyka
*Assistant Examiner* — Seahvosh Nikmanesh
(74) *Attorney, Agent, or Firm* — Eric J. Robinson; Robinson Intellectual Property Law Office, P.C.

(57) ABSTRACT

An SOI substrate having an SOI layer that can be used in practical applications even when a substrate with low upper temperature limit, such as a glass substrate, is used, is provided. A semiconductor device using such an SOI substrate, is provided. In bonding a single-crystal semiconductor layer to a substrate having an insulating surface or an insulating substrate, a silicon oxide film formed using organic silane as a material on one or both surfaces that are to form a bond is used. According to the present invention, a substrate with an upper temperature limit of 700° C. or lower, such as a glass substrate, can be used, and an SOI layer that is strongly bonded to the substrate can be obtained. In other words, a single-crystal semiconductor layer can be formed over a large-area substrate that is longer than one meter on each side.

23 Claims, 22 Drawing Sheets

U.S. PATENT DOCUMENTS

| | | | |
|---|---|---|---|
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,468,923 B1 | 10/2002 | Yonehara et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,908,797 B2 | 6/2005 | Takano | |
| 7,119,365 B2 | 10/2006 | Takafuji | |
| RE39,484 E | 2/2007 | Bruel | |
| 7,176,525 B2 | 2/2007 | Fukunaga | |
| 7,176,528 B2 | 2/2007 | Couillard et al. | |
| 7,192,844 B2 | 3/2007 | Couillard et al. | |
| 7,199,024 B2 | 4/2007 | Yamazaki | |
| 7,256,776 B2 | 8/2007 | Yamazaki et al. | |
| 7,399,681 B2 | 7/2008 | Couillard et al. | |
| 7,476,940 B2 | 1/2009 | Couillard et al. | |
| 7,508,034 B2 | 3/2009 | Takafuji et al. | |
| 7,605,053 B2 | 10/2009 | Couillard et al. | |
| 7,619,250 B2 | 11/2009 | Takafuji et al. | |
| 7,632,739 B2 | 12/2009 | Hebras | |
| 7,790,570 B2 | 9/2010 | Yamazaki | |
| 7,816,736 B2 | 10/2010 | Yamazaki | |
| 7,834,398 B2 | 11/2010 | Yamazaki | |
| 7,838,935 B2 | 11/2010 | Couillard et al. | |
| 7,867,873 B2 * | 1/2011 | Murakami et al. | 438/455 |
| 2002/0109144 A1 | 8/2002 | Yamazaki | |
| 2003/0183876 A1 | 10/2003 | Takafuji et al. | |
| 2004/0061176 A1 * | 4/2004 | Takafuji et al. | 257/347 |
| 2004/0104424 A1 | 6/2004 | Yamazaki | |
| 2005/0009252 A1 | 1/2005 | Yamazaki et al. | |
| 2005/0260800 A1 | 11/2005 | Takano | |
| 2006/0038228 A1 | 2/2006 | Aitken et al. | |
| 2006/0099773 A1 | 5/2006 | Maa et al. | |
| 2006/0110899 A1 | 5/2006 | Bourdelle et al. | |
| 2007/0020947 A1 | 1/2007 | Daval et al. | |
| 2007/0063281 A1 | 3/2007 | Takafuji et al. | |
| 2007/0087488 A1 | 4/2007 | Moriwaka | |
| 2007/0108510 A1 | 5/2007 | Fukunaga | |
| 2007/0173000 A1 | 7/2007 | Yamazaki | |
| 2007/0184632 A1 | 8/2007 | Yamazaki et al. | |
| 2007/0291022 A1 | 12/2007 | Yamazaki et al. | |
| 2008/0061301 A1 | 3/2008 | Yamazaki | |
| 2008/0067529 A1 | 3/2008 | Yamazaki | |
| 2008/0171443 A1 | 7/2008 | Hebras | |
| 2008/0213953 A1 | 9/2008 | Yamazaki | |
| 2008/0286941 A1 | 11/2008 | Yamazaki | |
| 2008/0286942 A1 | 11/2008 | Yamazaki | |
| 2009/0023267 A1 | 1/2009 | Daval et al. | |
| 2009/0023271 A1 | 1/2009 | Couillard et al. | |
| 2009/0095956 A1 | 4/2009 | Takafuji et al. | |
| 2010/0019242 A1 | 1/2010 | Takafuji et al. | |

FOREIGN PATENT DOCUMENTS

| | | |
|---|---|---|
| JP | 2000-012864 A | 1/2000 |
| JP | 2005-252244 A | 9/2005 |
| WO | WO-2008/087516 | 7/2008 |

OTHER PUBLICATIONS

Search Report (Application No. 08004498.5) Dated Feb. 22, 2010.

* cited by examiner

| Accelerating voltage | Ratio of hydrogen atom (H) (X : Y) | Ratio of hydrogen ion species (X : Y／3) |
|---|---|---|
| 8 0 k V | 1 : 4 4. 1 | 1 : 1 4. 7 |
| 6 0 k V | 1 : 4 2. 5 | 1 : 1 4. 2 |
| 4 0 k V | 1 : 4 3. 5 | 1 : 1 4. 5 |

SOI SUBSTRATE, METHOD FOR MANUFACTURING THE SAME, AND SEMICONDUCTOR DEVICE

BACKGROUND OF THE INVENTION

1. Field of the Invention

The present invention relates to silicon-on-insulator (SOI) substrates and semiconductor devices manufactured using SOI substrates. The present invention particularly relates to a bonding SOI technique and also relates to SOI substrates, which are obtained by bonding of a single-crystal or polycrystalline semiconductor layer to a substrate having an insulating surface such as a glass substrate, and semiconductor devices manufactured using SOI substrates.

2. Description of the Related Art

Integrated circuits have been developed, which use a semiconductor substrate called a silicon-on-insulator (SOI) substrate that has a thin single-crystal semiconductor layer over an insulating surface, instead of a silicon wafer that is manufactured by thinly slicing an ingot of a single-crystal semiconductor. When transistors that constitute a part of an integrated circuit are formed using an SOI substrate, parasitic capacitance between drains of the transistors and the substrate can be reduced and a semiconductor integrated circuit can be made to have higher performance. Therefore, SOI substrates have been attracting attention.

As a method for manufacturing SOI substrates, a hydrogen ion implantation separation method is known (for example, see Reference 1: U.S. Pat. No. 6,372,609). The hydrogen ion implantation separation method is a method in which hydrogen ions are implanted into a silicon wafer to form a microbubble layer at a predetermined depth from the surface, the surface into which hydrogen ions are implanted is superposed on another silicon wafer, heat treatment is performed to cause separation using the microbubble layer as a cleavage plane, and a thin silicon layer (SOI layer) is bonded to the other silicon wafer. In addition to the heat treatment for separation of an SOI layer, it is necessary to perform heat treatment in an oxidizing atmosphere to form an oxide film on the SOI layer, remove the oxide film, perform heat treatment at 1000° C. to 1300° C. in a reducing atmosphere to increase bonding strength, and recover a damaged layer on the surface of the SOI layer.

One of the known examples of semiconductor devices using SOI substrates is disclosed by the present applicant (see Reference 2: Japanese Published Patent Application No. 2000-12864). It is disclosed that heat treatment at 1050° C. to 1150° C. is necessary also in that case in order to eliminate trap levels and defects that are caused by stress in an SOI layer.

SUMMARY OF THE INVENTION

A conventional method for manufacturing an SOI substrate requires heat treatment at a high temperature of 1000° C. or higher in order to strengthen a bond between a substrate and an SOI layer and to recover a damaged layer on the surface of the SOI layer. Therefore, it has been impossible to form an SOI layer over a substrate with an upper temperature limit of about 700° C., like a glass substrate which is used for manufacture of a liquid crystal panel. Even if an SOI layer is provided over a glass substrate by a hydrogen ion implantation separation method, there is a problem in that the bonding strength of the SOI layer is weak because high-temperature heat treatment for increasing bonding strength cannot be applied.

In view of such a problem, it is an object of the present invention to provide an SOI substrate having an SOI layer that can be used in practical applications even when a substrate with low upper temperature limit, such as a glass substrate, is used. It is another object to provide a semiconductor device using such an SOI substrate.

In bonding a single-crystal semiconductor layer to a substrate having an insulating surface or an insulating substrate, a silicon oxide film is formed, preferably using organic silane as a material on one or both surfaces that are to form a bond. Examples of organic silane that can be used include silicon-containing compounds, such as tetraethoxysilane (TEOS) (chemical formula: $Si(OC_2H_5)_4$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$). In other words, in an SOI substrate having a structure in which a single-crystal semiconductor layer (SOI layer) is bonded to a substrate having an insulating surface or an insulating substrate, a layer which is smooth and has a hydrophilic surface is provided as a bonding surface on one or both surfaces that are to form a bond.

The SOI layer that is to be bonded to the substrate having an insulating surface or the insulating substrate is obtained by cleavage in an ion-doped layer formed in the single-crystal semiconductor substrate. The ion-doped layer is formed by implanting ions, which are generated by plasma excitation using a gas of hydrogen, helium, or a halogen typified by fluorine as a source gas, into the single-crystal semiconductor substrate. Note that the term "implant ions into a single-crystal semiconductor substrate" in this specification refers to a process to irradiate the single-crystal semiconductor substrate with ions accelerated by electric field so that the single-crystal semiconductor substrate contains elements of the ions. As example of the process, ion-doping is given. In this case, it is preferable to irradiate the single-crystal semiconductor substrate with a single type of ion or a plurality of types of ions of the same atom that has different masses. In the case of irradiating the single-crystal semiconductor substrate with hydrogen ions, the hydrogen ions preferably include $H^+$, $H_2^+$, and $H_3^+$ ions with a high proportion of $H_3^+$ ions. In the case of irradiating the single-crystal semiconductor substrate with ionized helium, the single-crystal semiconductor substrate can be substantially doped with $He^+$ ions alone even by ion doping without mass separation. Note that the term "substantially" means that the single-crystal semiconductor substrate contains a slight amount of ionized atmospheric elements. Note that the term "ion-doped layer" in this specification refers to a region which is weakened in a single-crystal semiconductor substrate so that the region includes fine voids by irradiating the single-crystal semiconductor substrate with ions, hereinafter referred to as "embrittlement layer". Note that the term "cleave" in this specification refers to separation of a single-crystal semiconductor substrate at an embrittlement layer. The cleavage allows a portion of the single-crystal semiconductor substrate to remain on a base substrate as a semiconductor layer.

When a single-crystal semiconductor layer that is to be separated from a single-crystal semiconductor substrate is bonded to a substrate serving as a base, the bond can be formed at a temperature of 700° C. or lower by the use of a specified silicon oxide film. Accordingly, even when a substrate with an upper temperature limit of 700° C. or lower, such as a glass substrate, is used, an SOI layer that is strongly bonded to the substrate can be obtained.

As a substrate to which a single-crystal semiconductor layer is fixed, it is possible to use any of a variety of glass substrates that are used in the electronics industry and that are referred to as non-alkali glass substrates, such as aluminosilicate glass substrates, aluminoborosilicate glass substrates, and barium borosilicate glass substrates. In other words, a single-crystal semiconductor layer can be formed over a substrate that is longer than one meter on each side. With the use of such a large-area substrate, not only a display device such as a liquid crystal display but also a semiconductor integrated circuit can be manufactured.

BRIEF DESCRIPTION OF THE DRAWINGS

FIG. 21 is a list of ratios of fitting parameters (hydrogen atom ratios and hydrogen ion species ratios).

DETAILED DESCRIPTION OF THE INVENTION

Figure 1A:
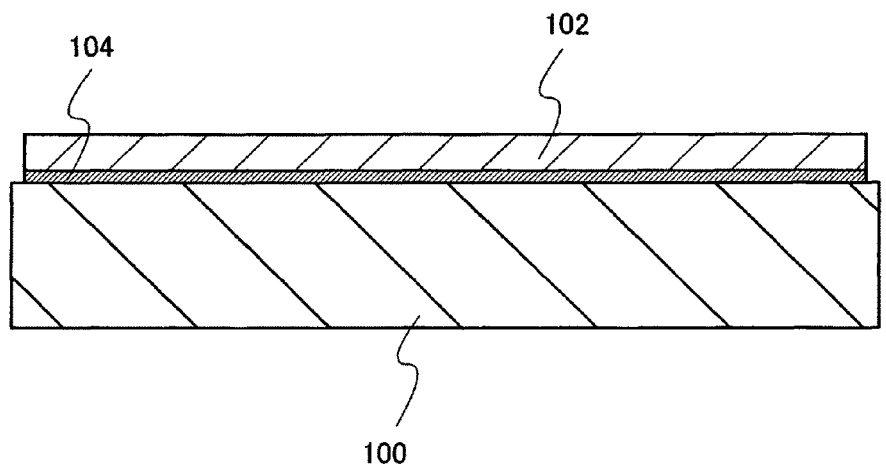
FIGS. 1A and 1B are cross-sectional views each showing a structure of an SOI substrate.
Figure 1B:
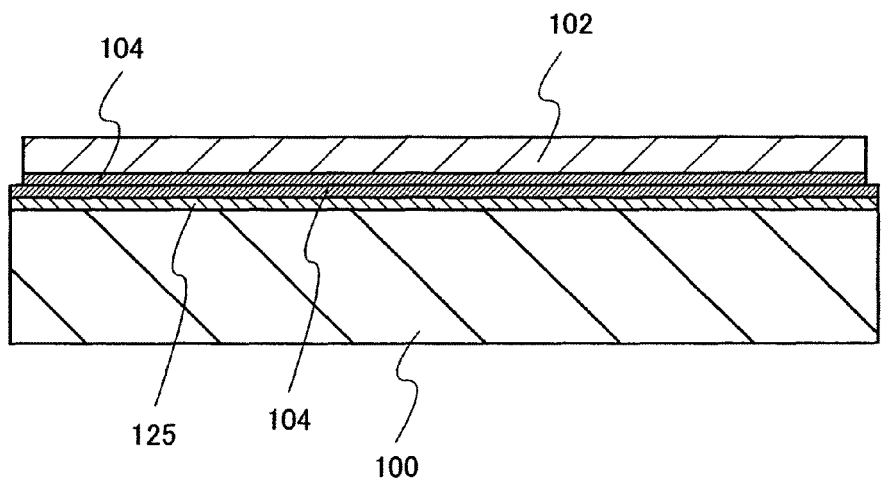

Each of FIGS. 1A and 1B shows the structure of an SOI substrate formed according to the present invention. In FIG. 1A, a base substrate 100 is a substrate having an insulating surface or an insulating substrate, and any of a variety of glass substrates that are used in the electronics industry, such as aluminosilicate glass substrates, aluminoborosilicate glass substrates, and barium borosilicate glass substrates, can be used. Alternatively, a quartz glass substrate or a semiconductor substrate such as a silicon wafer can be used. An SOI layer 102 is a single-crystal semiconductor layer, and single-crystal silicon is typically used. Alternatively, silicon which can be separated from a polycrystalline semiconductor substrate by a hydrogen ion implantation separation method or germanium which can be separated from a single-crystal semiconductor substrate or a polycrystalline semiconductor substrate by a hydrogen ion implantation separation method can be used. Still alternatively, a crystalline semiconductor substrate of a compound semiconductor such as silicon germanium, gallium arsenide, or indium phosphide can be used.

Between the base substrate 100 and the SOI layer 102 described above, a bonding layer 104 which is smooth and has a hydrophilic surface is provided. A silicon oxide film is suitable for use as the bonding layer 104. In particular, a silicon oxide film formed by a chemical vapor deposition method using an organic silane gas is preferable. Examples of organic silane that can be used include silicon-containing compounds such as tetraethoxysilane (TEOS) (chemical formula: $Si(OC_2H_5)_4$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

The bonding layer 104 which is smooth and has a hydrophilic surface is provided at a thickness of 5 nm to 500 nm. With such a thickness, it is possible to smooth surface roughness of a surface on which a film is to be formed (a surface which is to form a bond) and also to ensure smoothness of a growing surface of the film. In addition, providing the bonding layer 104 makes it possible to mitigate thermal distortion of the substrate and the SOI layer that are to be bonded together. The base substrate 100 may also similarly be provided with the bonding layer 104 that is made of a silicon oxide film. In other words, in bonding the SOI layer 102 to the base substrate 100 that is a substrate having an insulating surface or an insulating substrate, the base substrate 100 and the SOI layer 102 can be strongly bonded together if the bonding layer 104 made of a silicon oxide film using organic silane as a material is provided over one of or both of a surface of the base substrate 100 that is to form a bond and a surface of the SOI layer 102 that is to form a bond.

FIG. 1B shows a structure in which the base substrate 100 is provided with a barrier layer 125 and the bonding layer 104. When the SOI layer 102 is bonded to the base substrate 100, by provision of the barrier layer 125, the SOI layer 102 can be prevented from being contaminated by an impurity such as mobile ions like alkali metal or alkaline earth metal that are diffused from a glass substrate that is used as the base substrate 100. The bonding layer 104 on the base substrate 100 side may be provided suitably.

Figure 2A:
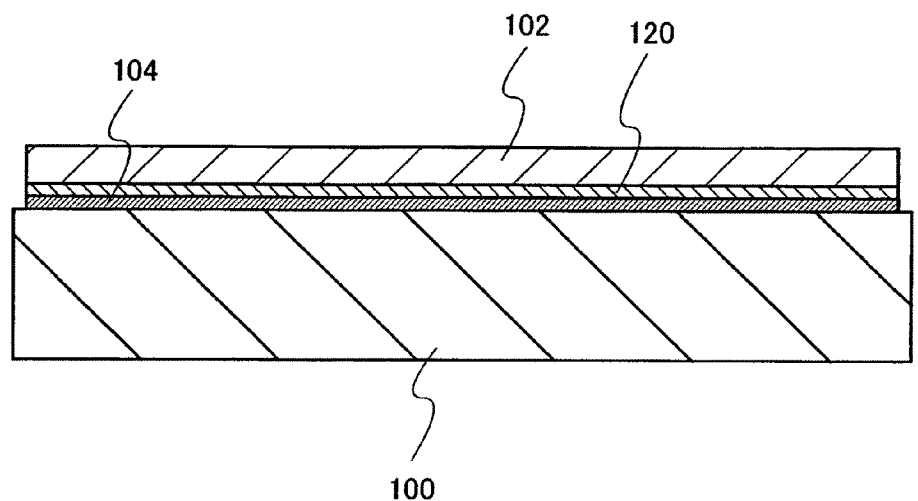
FIGS. 2A and 2B are cross-sectional views each showing a structure of an SOI substrate.
Figure 2B:
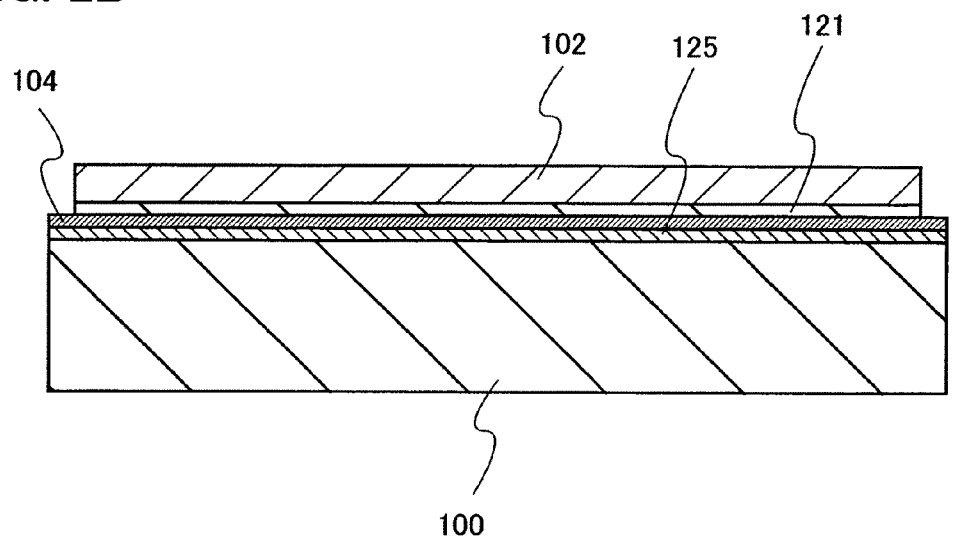

Each of FIGS. 2A and 2B shows another structure of an SOI substrate formed according to the present invention. FIG. 2A shows a structure in which a nitrogen-containing insulating layer 120 is provided between the SOI layer 102 and the bonding layer 104. The nitrogen-containing insulating layer 120 is formed using a single layer or a stacked layer of a plurality of films selected from a silicon nitride film, a silicon nitride oxide film, and a silicon oxynitride film. For example, the nitrogen-containing insulating layer 120 can be formed by stacking a silicon oxynitride film and a silicon nitride oxide film in order from the SOI layer 102 side. The bonding layer 104 is provided in order to form a bond with the base substrate 100 whereas the nitrogen-containing insulating layer 120 is preferably provided in order to prevent the SOI layer 102 from being contaminated by diffusion of an impurity such as mobile ions or moisture. Alternatively, the nitrogen-containing insulating layer 120 can be formed by stacking a silicon nitride oxide film and a silicon oxide film that is formed by thermal oxidation together.

Note that a silicon oxynitride film here means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

FIG. 2B shows a structure in which the base substrate 100 is provided with the bonding layer 104. Between the base substrate 100 and the bonding layer 104, the barrier layer 125 is preferably provided. The barrier layer 125 is provided in order to prevent the SOI layer 102 from being contaminated by an impurity such as mobile ions like alkali metal or alkaline earth metal that are diffused from a glass substrate that is used as the base substrate 100. In addition, the SOI layer 102 is provided with a silicon oxide film 121. This silicon oxide film 121 forms a bond with the bonding layer 104 to fix the SOI layer 102 over the base substrate 100. The silicon oxide film 121 is preferably formed by thermal oxidation. Alternatively, similarly to the bonding layer 104, the silicon oxide film 121 may be formed by a chemical vapor deposition method using TEOS. Still alternatively, the silicon oxide film 121 can be formed using a chemical oxide. A chemical oxide can be formed by, for example, treatment of a surface of a semiconductor substrate that is to become an SOI layer with ozone-containing water. Because a chemical oxide reflects the shape of the surface of a semiconductor substrate, it is preferable that the semiconductor substrate be flat so that the chemical oxide also becomes flat.

A method for manufacturing such an SOI substrate is described with reference to FIGS. 3A to 3C and FIG. 4.

Figure 3A:
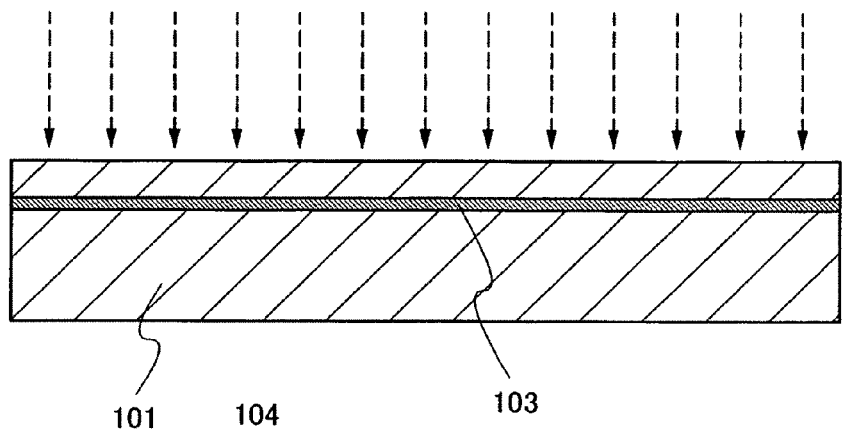
FIGS. 3A to 3C are cross-sectional views showing a method for manufacturing an SOI substrate.

A semiconductor substrate 101 shown in FIG. 3A is cleaned, and the semiconductor substrate is irradiated with ions that are accelerated by an electric field so that an embrittlement layer 103 is formed at a predetermined depth from the surface of the semiconductor substrate 101. The thickness of the SOI layer that is to be transferred to a base substrate. The thickness of the SOI layer is set to be 5 nm to 500 nm, preferably, 10 nm to 200 nm. An accelerating voltage for irradiating the semiconductor substrate 101 with ions is set in consideration of such a thickness. The embrittlement layer 103 is formed by the irradiation of the semiconductor substrate 101 with ions of hydrogen, helium, or a halogen typified by fluorine. In this case, it is preferable to irradiate the semiconductor substrate 101 with a single type of ion or a plurality of types of ions of the same atom that has different masses. In the case of irradiating the semiconductor substrate 101 with hydrogen ions, the hydrogen ions preferably include $H^+$, $H_2^+$, and $H_3^+$ ions with a high proportion of $H_3^+$ ions. With a high proportion of $H_3^+$ ions, the implantation efficiency can be increased and irradiation time can be shortened. By thus performing the irradiation with ions where the proportion of $H_3^+$ ions is higher than that of $H^+$ ions or $H_2^+$ ions so that the semiconductor substrate 101 contains a large number of hydrogen ions, separation can be easily performed with a lower dose than in the case of performing irradiation with ions where the proportion of $H_3^+$ ions is not higher than that of other hydrogen ions.

Because the semiconductor substrate 101 is irradiated with ions at a high dose, there are cases where the surface of the semiconductor substrate 101 is roughened. Therefore, a protective film for the semiconductor substrate 101, such as a silicon oxide film, a silicon nitride film, or a silicon nitride oxide film, with a thickness of 0.5 nm to 200 nm, may be provided on a surface which is irradiated with ions.

Figure 3B:
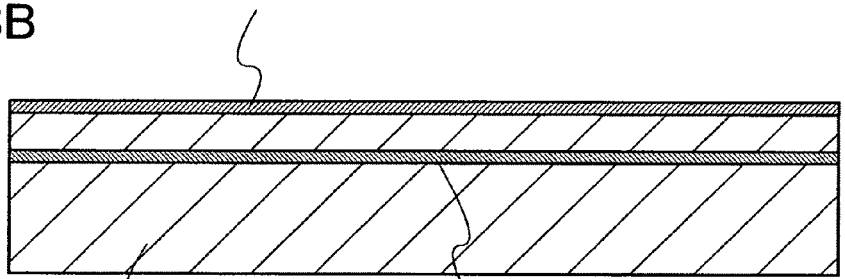

Next, as shown in FIG. 3B, a silicon oxide film is formed as a bonding layer 104 over a surface of the semiconductor substrate 101 which is to form a bond with a base substrate. The silicon oxide film is preferably formed by a chemical vapor deposition method using an organic silane gas as described above. The silicon oxide film can also be formed by a chemical vapor deposition method using a different silane gas. When a single-crystal semiconductor substrate is used as the semiconductor substrate 101, film formation by a chemical vapor deposition method is performed at a temperature, for example, 350° C. or lower, at which degassing of the embrittlement layer 103 that is formed in the substrate does not occur (a temperature at which the surface of the silicon oxide film that is formed as the bonding layer 104 is not roughened or at which a crack is not formed in the embrittlement layer 103). When a single-crystal or polycrystalline semiconductor substrate is used as the semiconductor substrate 101, heat treatment for separating an SOI layer from the substrate is performed at a higher temperature than the temperature at which the bonding layer 104 is formed.

Figure 3C:
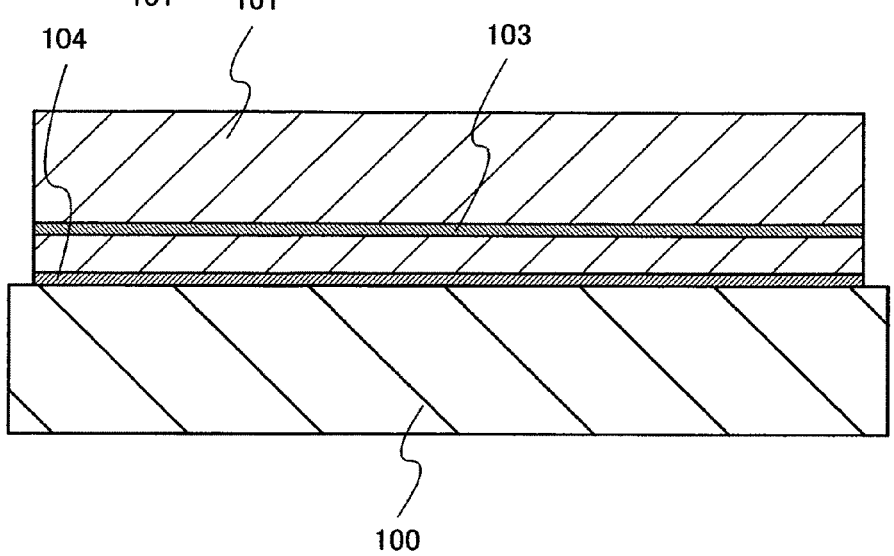

FIG. 3C shows a mode in which a base substrate 100 is disposed in contact with the surface of the bonding layer 104 formed on the semiconductor substrate 101, to bond the two to each other. A surface which is to form a bond is cleaned sufficiently. By locating the base substrate 100 in close contact with the bonding layer 104, a bond is formed therebetween by Van der Waals forces. By pressing the base substrate 100 and the semiconductor substrate 101 against each other, a stronger bond than the bond by Van der Waals forces can be formed by hydrogen bonding.

In order to form a favorable bond, the surface which is to form a bond may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such a surface treatment makes it possible to increase bonding strength between different kinds of materials even if a later heat treatment step is performed at a temperature of 200° C. to 400° C.

After the base substrate 100 and the semiconductor substrate 101 are bonded to each other with the bonding layer 104 interposed therebetween, it is preferable that heat treatment or pressure treatment or both heat treatment and pressure treatment be performed. Heat treatment or pressure treatment makes it possible to increase bonding strength. The heat treatment is preferably performed at a temperature equal to or lower than the upper temperature limit of the base substrate 100 and at a temperature at which the element which the embrittlement layer 103 contains in the previous ion irradiation step is detached. The pressure treatment is performed so that pressure is applied perpendicular to the bonding surface, in consideration of the pressure resistance of the base substrate 100 and the semiconductor substrate 101.

Figure 4:
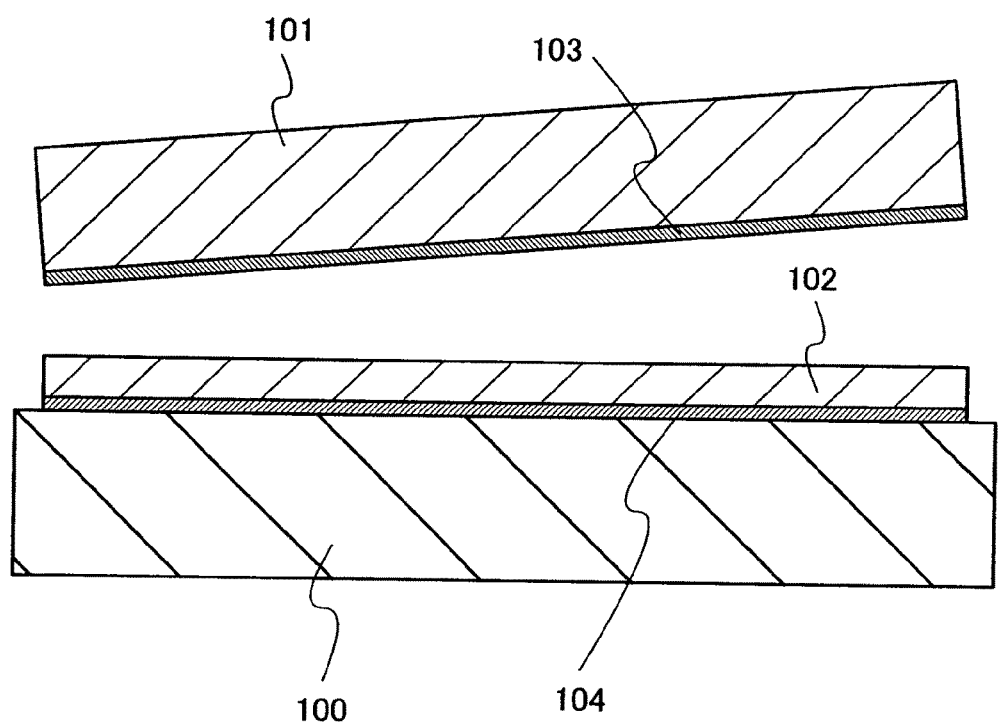
FIG. 4 is a cross-sectional view showing a method for manufacturing an SOI substrate.

In FIG. 4, after the base substrate 100 and the semiconductor substrate 101 are bonded to each other, heat treatment is performed to separate the semiconductor substrate 101 from the base substrate 100 with the embrittlement layer 103 used as a cleavage plane. The heat treatment is preferably performed at a temperature ranging from the temperature at which the bonding layer 104 is formed to the upper temperature limit of the base substrate 100. When the heat treatment is performed at, for example, 400° C. to 600° C., a change occurs in the volume of fine voids formed in the embrittlement layer 103, which enables cleavage to occur along the embrittlement layer 103. Because the bonding layer 104 is bonded to the base substrate 100, an SOI layer 102 having the same crystallinity as the semiconductor substrate 101 is left remaining over the base substrate 100.

Figure 5A:
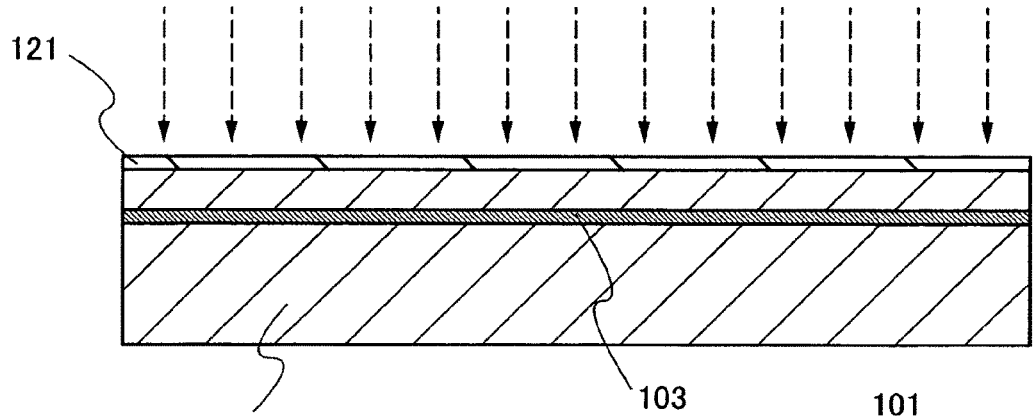
FIGS. 5A to 5C are cross-sectional views showing a method for manufacturing an SOI substrate.
Figure 5B:
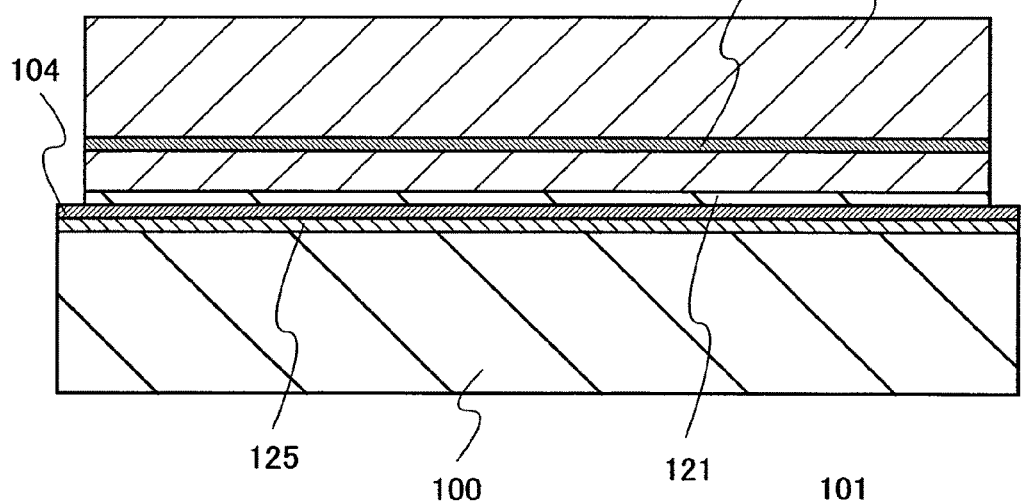
Figure 5C:
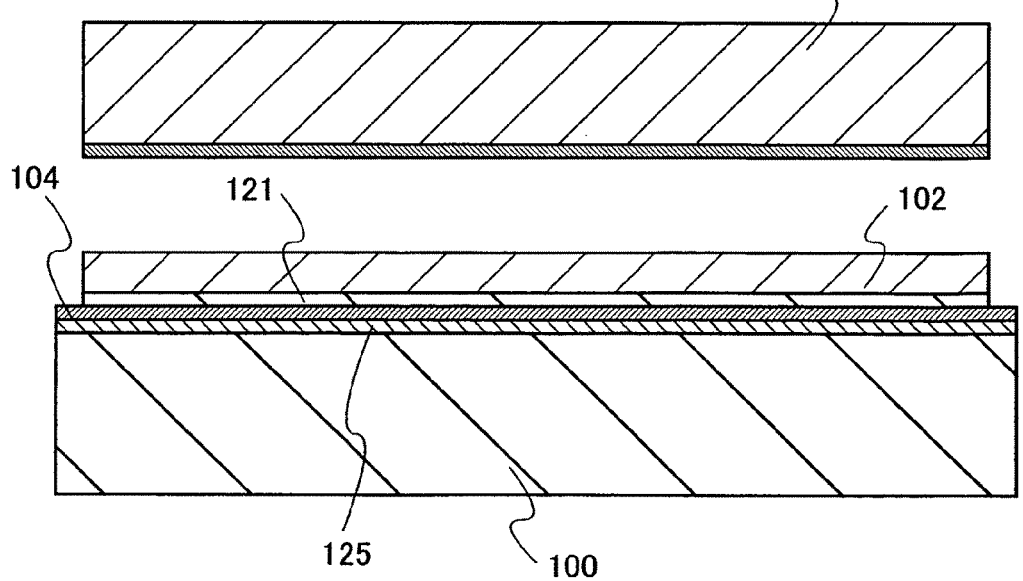

FIGS. 5A to 5C show steps of forming an SOI layer with a bonding layer provided on the base substrate 100 side in a method for manufacturing an SOI substrate. FIG. 5A shows a step in which the semiconductor substrate 101 which is provided with the silicon oxide film 121 is irradiated with ions that are accelerated by an electric field so that the embrittlement layer 103 is formed at a predetermined depth. The irradiation with ions of hydrogen, helium, or a halogen typified by fluorine is similar to the case shown in FIG. 3A. By formation of the silicon oxide film 121 over the surface of the semiconductor substrate 101, the surface which is irradiated with ions can be prevented from being damaged and from losing its planarity.

FIG. 5B shows a step in which a bond is formed between the base substrate provided with the barrier layer 125 and the bonding layer 104 and the semiconductor substrate 101 provided with the silicon oxide film 121. A bond is formed by disposing the bonding layer 104 over the base substrate 100 in contact with the surface of the silicon oxide film 121 formed on the semiconductor substrate 101.

After that, the semiconductor substrate 101 is separated from the base substrate 100 as shown in FIG. 5C. Heat treatment for separating the semiconductor substrate 101 from the base substrate 100 is performed similarly to the case shown in FIG. 4. Accordingly, the SOI substrate shown in FIG. 2B can be obtained.

In this manner, in accordance with this mode, a substrate with an upper temperature limit of 700° C. or lower, such as a glass substrate, can be used as the base substrate 100 and the SOI layer 102 that is strongly bonded to the substrate can be obtained. As the base substrate 100, it is possible to use any of a variety of glass substrates that are used in the electronics industry and that are referred to as non-alkali glass substrates, such as aluminosilicate glass substrates, aluminoborosilicate glass substrates, and barium borosilicate glass substrates. In other words, a single-crystal semiconductor layer can be formed over a substrate that is longer than one meter on each side. With the use of such a large-area substrate, not only a display device such as a liquid crystal display but also a semiconductor integrated circuit can be manufactured.

Figure 6A:
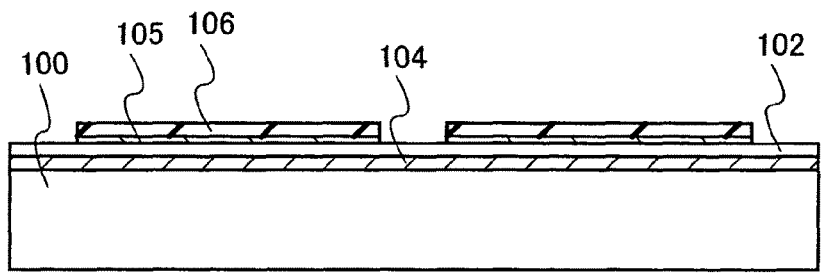
FIGS. 6A to 6E are cross-sectional views showing a method for manufacturing a semiconductor device using an SOI substrate.

Next, a method for manufacturing a semiconductor device using an SOI substrate is described with reference to FIGS. 6A to 7B. In FIG. 6A, the base substrate 100 is provided with the SOI layer 102 with the bonding layer 104 interposed therebetween. Over the SOI layer 102, a silicon nitride layer 105 and a silicon oxide layer 106 are formed in a region corresponding to an element formation region. The silicon oxide layer 106 is used as a hard mask when the SOI layer 102 is etched for element isolation. The silicon nitride layer 105 is used as an etching stopper in a later step.

The thickness of the SOI layer 102 ranges from 5 nm to 500 nm, preferably, 10 nm to 200 mm. The thickness of the SOI layer 102 can be set as appropriate by control of the depth of the embrittlement layer 103 that is shown in FIGS. 3A to 3C. To the SOI layer 102, a p-type impurity such as boron, aluminum, or gallium is added in order to control threshold voltage. For example, boron may be added as a p-type impurity at a concentration of $5\times10^{16}$ cm$^{-3}$ to $1\times10^{18}$ cm$^{-3}$.

Figure 6B:
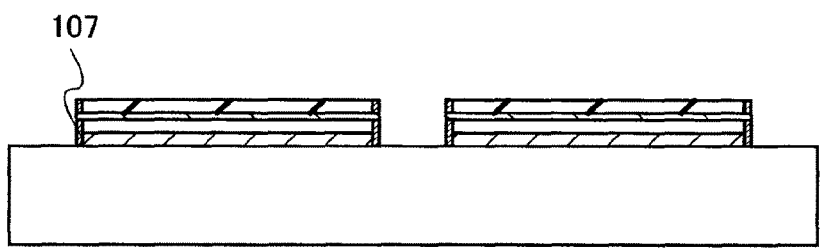

FIG. 6B shows a step of etching the SOI layer 102 and the bonding layer 104 with the silicon oxide layer 106 used as a mask. Next, exposed end surfaces of the SOI layer 102 and the bonding layer 104 are nitrided by plasma treatment. By this nitridation treatment, a silicon nitride layer 107 is formed in at least a peripheral end portion of the SOI layer 102. The silicon nitride layer 107 has an insulating property and has the effect of preventing leak current from flowing at the end surface of the SOI layer 102. In addition, because of its resistance to oxidation, the silicon nitride layer 107 can prevent an oxide film from growing from the end surface into a "bird's beak" between the SOI layer 102 and the bonding layer 104.

Figure 6C:
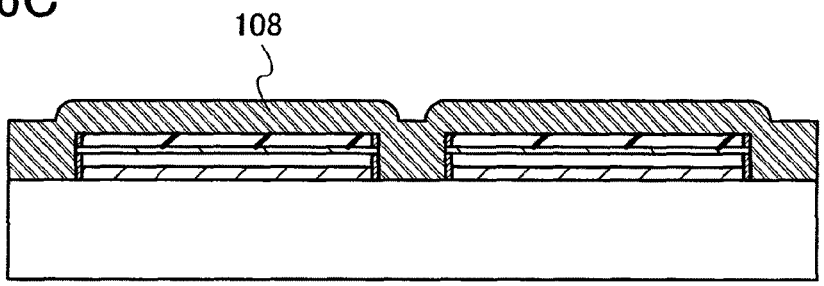

FIG. 6C shows a step of deposition of an element isolation insulating layer 108. As the element isolation insulating layer 108, a silicon oxide film which is deposited by a chemical vapor deposition method using TEOS is used. The element isolation insulating layer 108 is deposited thickly so that the SOI layer 102 is buried.

Figure 6D:
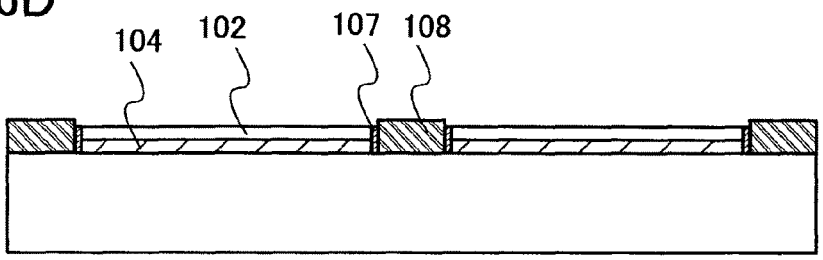

FIG. 6D shows a step of removing of the element isolation insulating layer 108 to expose the silicon nitride layer 105. This removal step may be performed using dry etching or chemical mechanical polishing processing. The silicon nitride layer 105 functions as an etching stopper. The element isolation insulating layer 108 is left remaining to fill in a gap between the SOI layers 102. The silicon nitride layer 105 is then removed.

Figure 6E:
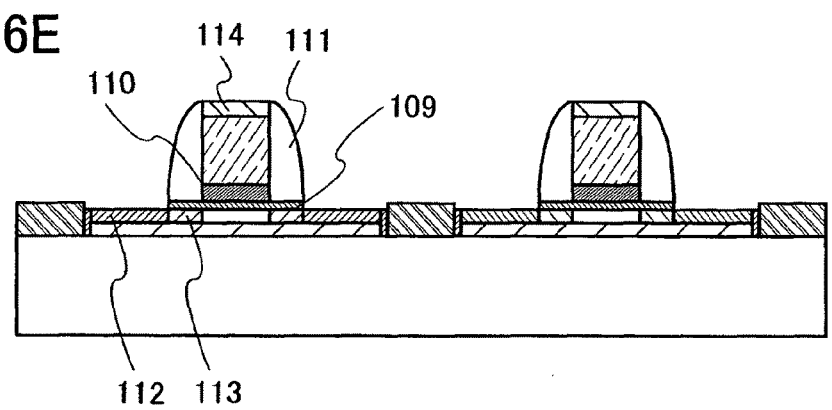

In FIG. 6E, after the SOI layer 102 is exposed, a gate insulating layer 109, a gate electrode 110, and a sidewall insulating layer 111 are formed, and a first impurity region 112 and a second impurity region 113 are formed. An insulating layer 114 is formed of silicon nitride and used as a hard mask when the gate electrode 110 is etched.

Figure 7A:
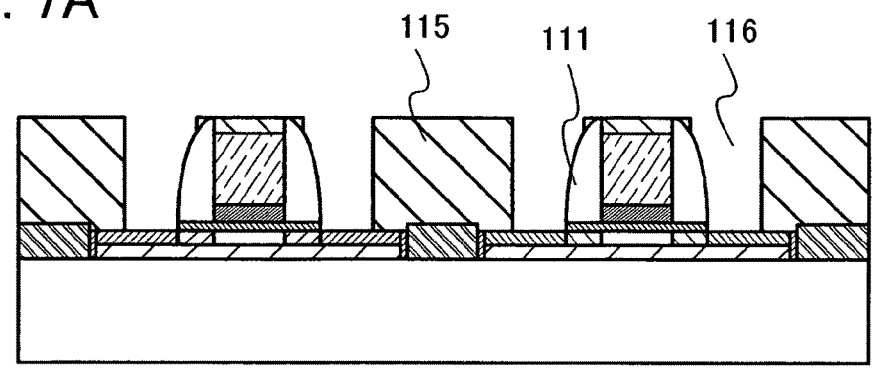
FIGS. 7A and 7B are cross-sectional views showing a method for manufacturing a semiconductor device using an SOI substrate.

In FIG. 7A, an interlayer insulating layer 115 is formed. As the interlayer insulating layer 115, a borophosphosilicate glass (BPSG) film is formed and then planarized by reflow. Alternatively, a silicon oxide film may be formed using TEOS and then planarized by chemical mechanical polishing processing. In the planarizing processing, the insulating layer 114 over the gate electrode 110 functions as an etching stopper. A contact hole 116 is formed in the interlayer insulating layer 115. The contact hole 116 is formed into a self-aligned contact structure using the sidewall insulating layer 111.

Figure 7B:
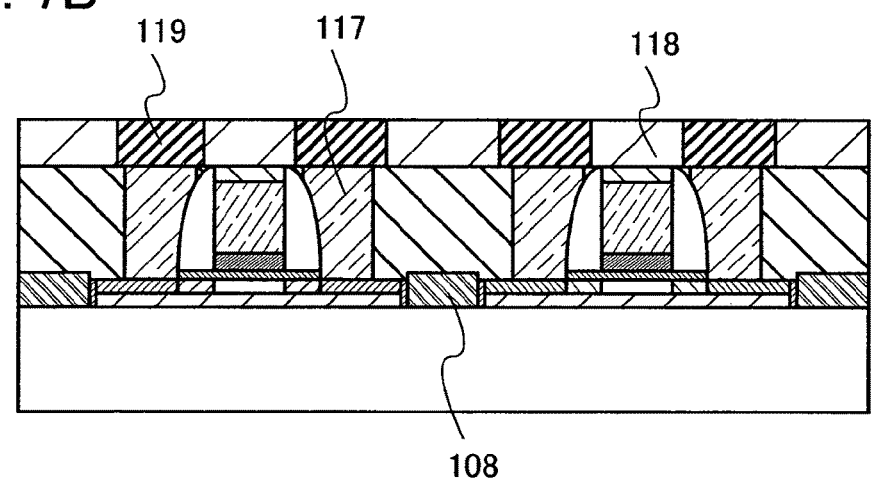

After that, as shown in FIG. 7B, a contact plug 117 is formed by a CVD method using tungsten hexafluoride. Furthermore, an insulating layer 118 is formed; an opening is formed to match the contact plug 117; and a wiring 119 is provided therein. The wiring 119 is formed of aluminum or an aluminum alloy and is provided with upper and lower metal films of molybdenum, chromium, titanium, or the like as barrier metal films.

In this manner, a field-effect transistor can be manufactured using the SOI layer 102 that is bonded to the base substrate 100. Because the SOI layer 102 formed according to this mode is a single-crystal semiconductor with uniform crystal orientation, a uniform, high-performance field-effect transistor can be obtained. In other words, it is possible to suppress inhomogeneity of values of important transistor characteristics, such as threshold voltage and mobility, and to achieve high performance such as high mobility.

Figure 8:
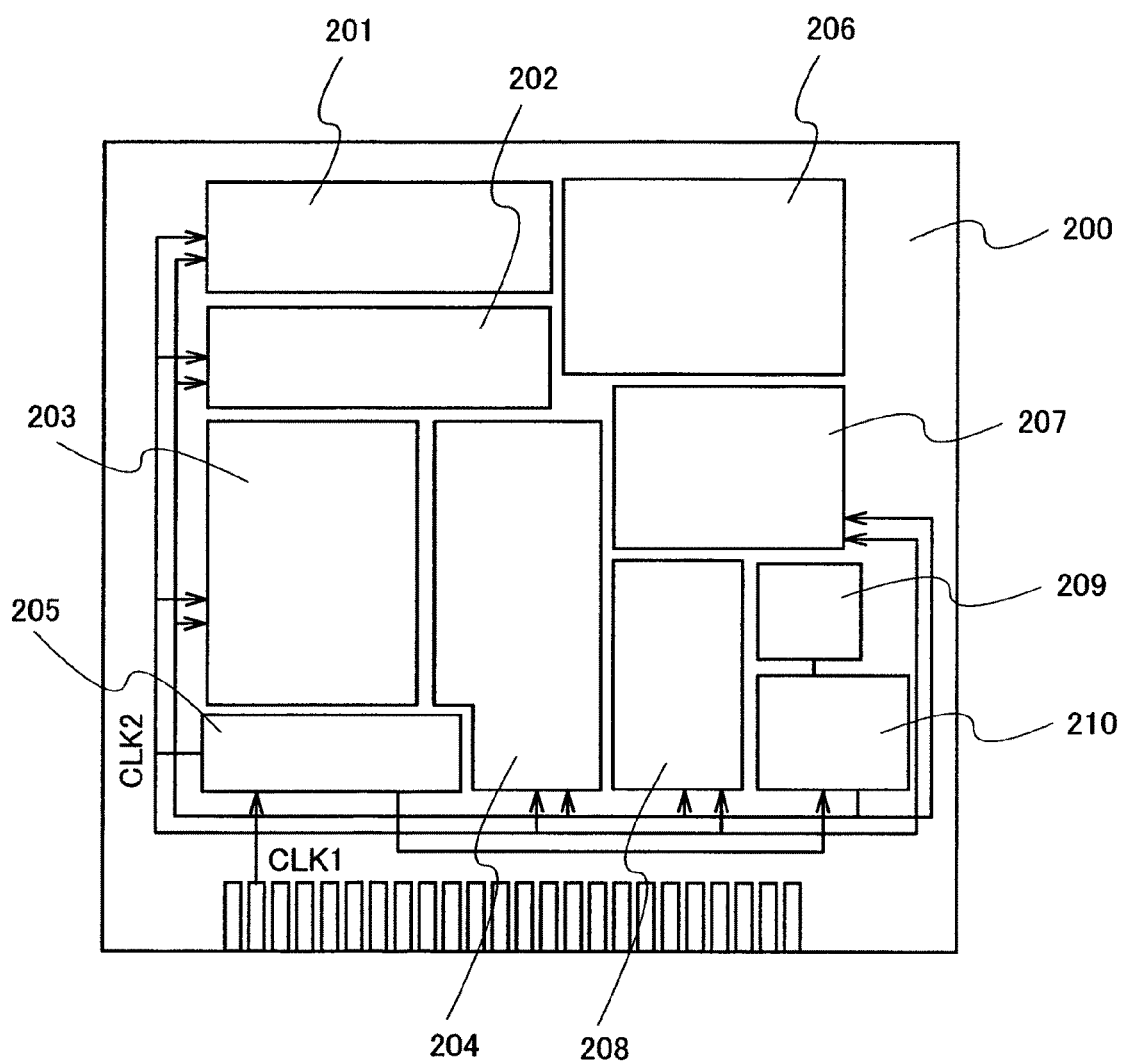
FIG. 8 is a block diagram showing a structure of a microprocessor that is obtained using an SOI substrate.

FIG. 8 shows a structure of a microprocessor obtained using the SOI substrate as an example of a semiconductor device. A microprocessor 200 is manufactured using the SOI substrate formed according to this mode as described above. This microprocessor 200 has an arithmetic logic unit (ALU) 201, an arithmetic logic unit controller (ALU controller) 202, an instruction decoder 203, an interrupt controller 204, a timing controller 205, a register 206, a register controller 207, a bus interface (Bus I/F) 208, a read-only memory (ROM) 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the internal clock signal CLK2 to the various above-mentioned circuits. Obviously, the microprocessor 200 shown in FIG. 8 is only an example in which the configuration is simplified, and an actual microprocessor may have various configurations depending on the uses.

The above-described microprocessor 200 can achieve not only an increase in processing speed but also a reduction in power consumption because an integrated circuit is formed using a single-crystal semiconductor layer (SOI layer) with uniform crystal orientation which is bonded to a substrate having an insulating surface or an insulating substrate.

Figure 9:
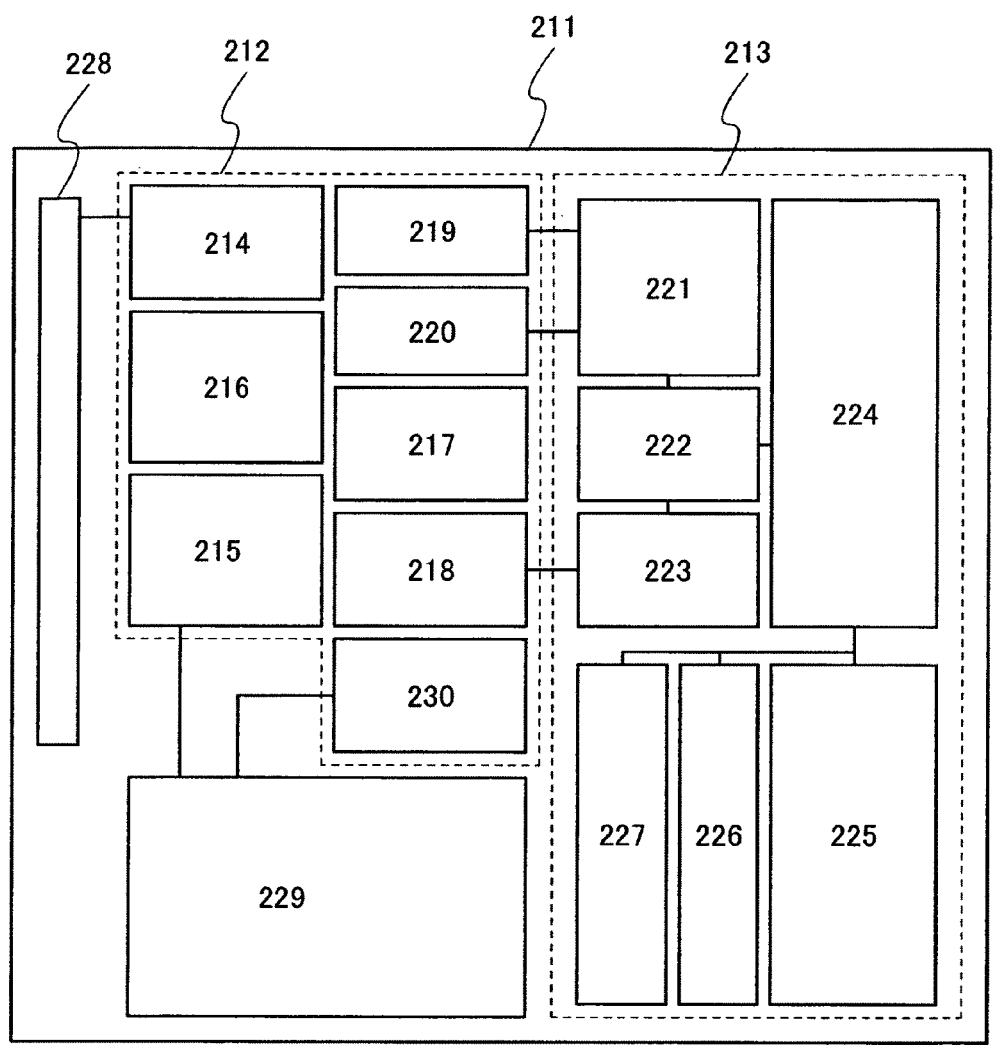
FIG. 9 is a block diagram showing a structure of an RFCPU that is obtained using an SOI substrate.

Next, a structure of an RFCPU obtained using the SOI substrate is described with reference to FIG. 9 as an example of a semiconductor device having an arithmetic function that enables contactless data transmission and reception. FIG. 9 shows an example of a computer that operates to transmit and receive signals to and from an external device by wireless communication (such a computer is hereinafter referred to as an RFCPU). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, a modulator circuit 220, and a power management circuit 230. The digital circuit portion 213 has an RF interface 221, a control register 222, a clock controller 223, a CPU interface 224, a central processing unit (CPU) 225, a random-access memory (RAM) 226, and a read-only memory (ROM) 227.

The operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and capacitor portion 229 may be mounted as a different component on a substrate having an insulating surface which is included in the RFCPU 211.

The reset circuit 217 generates a signal for resetting and initializing the digital circuit portion 213. For example, the reset circuit 217 generates a signal which rises after rise in the power supply voltage with delay as a reset signal. The oscillator circuit 218 changes the frequency and duty ratio of a clock signal in response to a control signal generated by the constant voltage circuit 216. The demodulator circuit 219 formed using a low-pass filter binarizes the amplitude of, for example, a received amplitude-modulated (ASK) signal. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by the power management circuit 230.

A signal input from the antenna 228 to the RFCPU 211 is demodulated by the demodulator circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the CPU interface 224. The CPU interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 225 using a program.

The above-described RFCPU 211 can achieve not only an increase in processing speed but also a reduction in power consumption because an integrated circuit is formed using a single-crystal semiconductor layer (SOI layer) with uniform crystal orientation which is bonded to a substrate having an insulating surface or an insulating substrate. This makes it possible to ensure the operation for a long period of time even when the capacitor portion 229 which supplies power is downsized.

EMBODIMENT 1

In this embodiment, a method for manufacturing an SOI substrate is described with reference to FIGS. 10A to 11B.

Figure 10A:
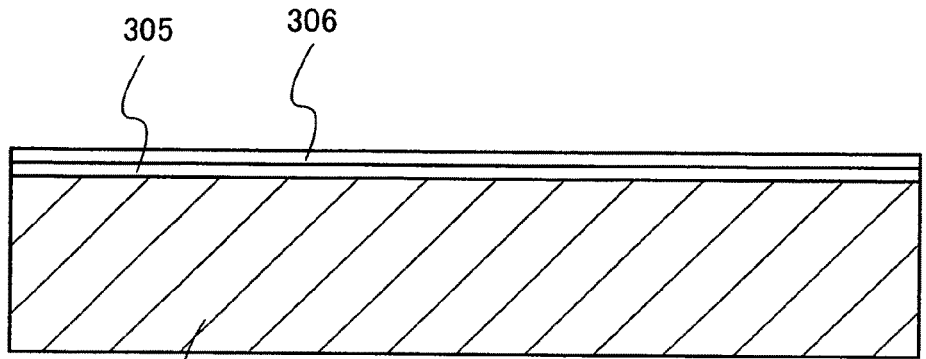
FIGS. 10A to 10C are cross-sectional views showing a method for manufacturing an SOI substrate according to Embodiment 1.

First, an insulating film is formed over a single-crystal semiconductor substrate. FIG. 10A shows a mode in which a silicon oxynitride film 305 and a silicon nitride oxide film 306 are formed as the insulating film over a single-crystal silicon substrate 301 from which a natural oxide film has been removed. The silicon oxynitride film 305 is formed at a thickness of 100 nm by a plasma CVD method using an $SiH_4$ gas and an $N_2O$ gas, and the silicon nitride oxide film 306 is formed at a thickness of 50 nm using an $SiH_4$ gas, an $N_2O$ gas, and an $NH_3$ gas.

Figure 10B:
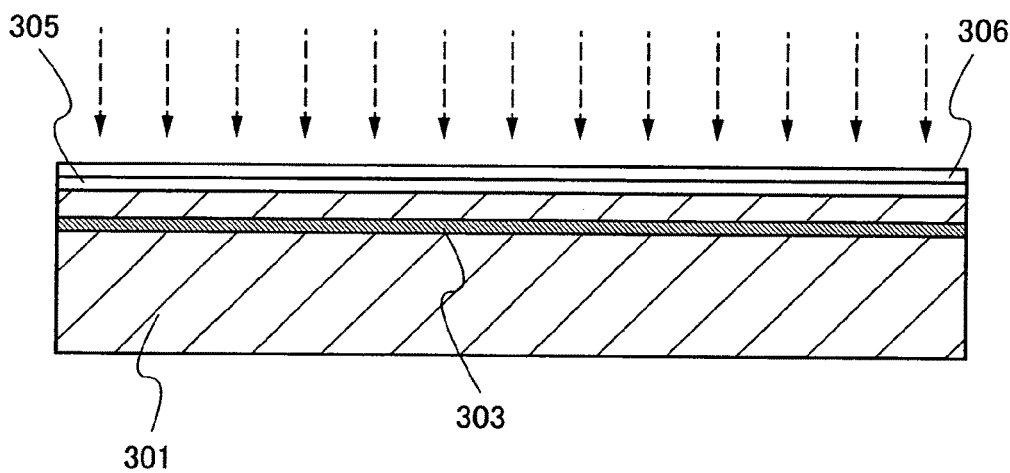

Then, as shown in FIG. 10B, hydrogen ions are added to the single-crystal silicon substrate 301 from the surface of the silicon nitride oxide film 306 by using an ion doping apparatus. The ion doping apparatus is an apparatus used to irradiate a substrate, without mass separation, with ions generated from a source gas, which are accelerated by an electric field. With the use of this apparatus, ion doping of even a large-area substrate can be performed with high efficiency and at high dose. In this embodiment, hydrogen is ionized and added to form an embrittlement layer 303 in the single-crystal silicon substrate 301.

Note that the thickness of a single-crystal silicon layer that is to be transferred to a glass substrate later is determined by ion doping conditions. Therefore, the accelerating voltage and dose in performing ion doping are adjusted in consideration of the thickness of the single-crystal silicon layer that is to be transferred. For example, the thickness of the single-crystal silicon layer is set to be 10 nm to 500 nm, preferably, 20 nm to 100 nm. The accelerating voltage for ion doping may be set to be 20 kV to 100 kV, preferably, 20 kV to 70 kV, and the dose may be set to be $1\times10^{16}$ ions/cm$^2$ to $4\times10^{16}$ ions/cm$^2$, preferably, $1\times10^{16}$ ions/cm$^2$ to $2.5\times10^{16}$ ions/cm$^2$. In this embodiment, ion doping is performed with an accelerating voltage of 80 kV and a dope of $2\times10^{16}$ ions/cm$^2$.

In this case, it is preferable to irradiate the single-crystal silicon substrate 301 with a single type of ion or a plurality of types of ions of the same atom that has different masses. In the case of irradiating the single-crystal silicon substrate 301 with hydrogen ions, the hydrogen ions preferably include $H^+$, $H_2^+$, and $H_3^+$ ions with a high $H_3^+$-ion proportion of about 80%. By thus irradiating the single-crystal silicon substrate 301 with ions where the proportion of $H_3^+$ ions is higher than that of $H^+$ ions or $H_2^+$ ions so that the single-crystal silicon substrate 301 contains a large amount of hydrogen, separation in the embrittlement layer 303 can be easily caused with low ion dose in a later heat treatment step. In this case, by provision of the silicon nitride oxide film 306 and the silicon oxynitride film 305 on the ion-doping side of the single-crystal silicon substrate 301, the surface of the single-crystal silicon substrate 301 can be prevented from being roughened by ion doping.

Alternatively, as the insulating film formed over the single-crystal semiconductor substrate, a film with a thickness of 0.5 nm to 300 nm, preferably, 0.8 nm to 200 nm may be used. In this case, ion doping may be performed with an accelerating voltage of 5 kV to 100 kV, preferably, 10 kV to 70 kV at a dose of $7\times10^{15}$ ions/cm$^2$ to $5\times10^{16}$ ions/cm$^2$, preferably, $8\times10^{15}$ ions/cm$^2$ to $2.5\times10^{16}$ ions/cm$^2$.

Figure 10C:
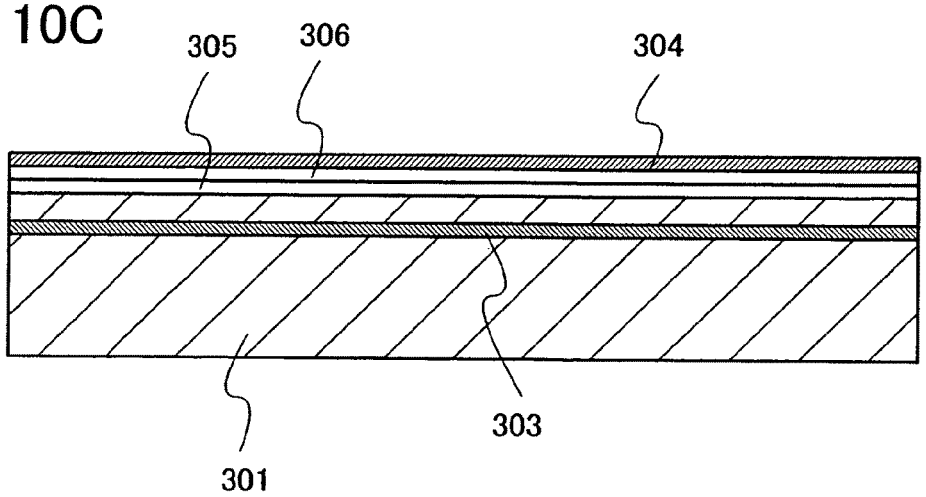

Next, a silicon oxide film 304 is formed over the silicon nitride oxide film 306 as shown in FIG. 10C. The silicon oxide film 304 is formed at a thickness of 50 nm by a plasma CVD method using tetraethoxysilane (TEOS) (chemical formula: $Si(OC_2H_5)_4$) and an oxygen gas. The film formation temperature is set to be 350° C. or lower. This film formation temperature is set to be a temperature at which the surface of the silicon oxide film 304 is not roughened due to detachment of hydrogen from the embrittlement layer 303 or at which a crack is not formed in the embrittlement layer 303 due to the detachment of hydrogen.

Figure 11A:
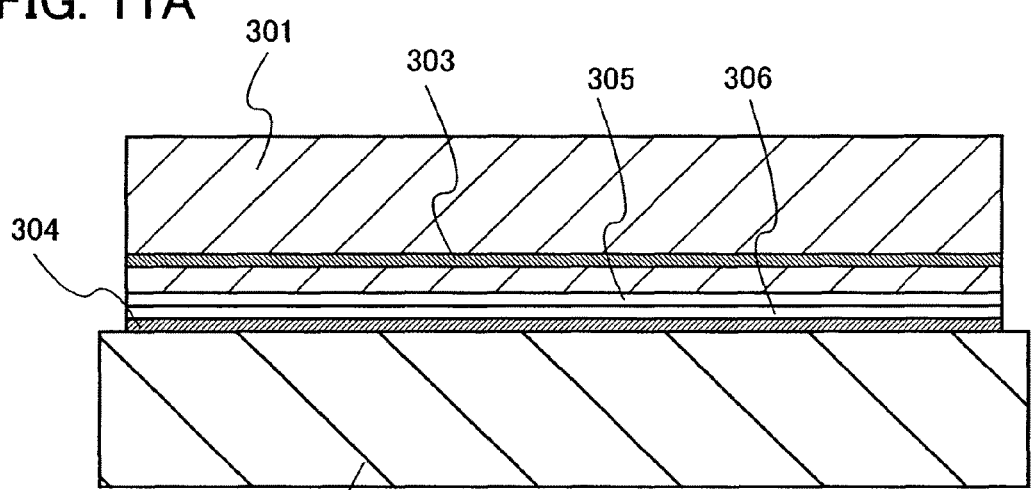
FIGS. 11A and 11B are cross-sectional views showing a method for manufacturing an SOI substrate according to Embodiment 1.
Figure 11B:
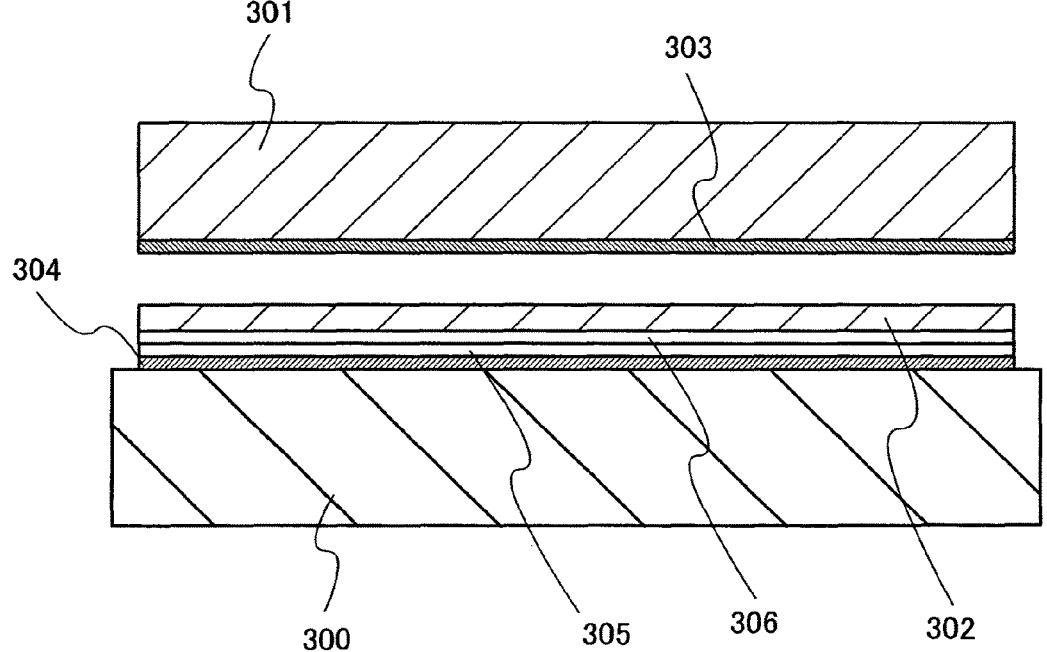

FIG. 11A shows a step of superposing a glass substrate 300 which has been subjected to ultrasonic cleaning and the single-crystal silicon substrate 301 on each other, with the silicon oxide film 304 interposed therebetween, and pressing the two against each other to form a bond. After that, heat treatment is performed at 400° C. for 10 minutes in a nitrogen atmosphere and then at 500° C. for two hours, and the temperature is held constant at 400° C. for several hours and then gradually lowered to room temperature. Accordingly, as shown in FIG. 11B, a crack can be formed in the embrittlement layer 303 to separate the single-crystal silicon substrate 301 from the glass substrate 300, and the bond between the silicon oxide film 304 and the glass substrate 300 can be strengthened.

In this manner, a single-crystal silicon layer 302 can be formed over the glass substrate 300 at a temperature at which the glass substrate 300 does not warp. The single-crystal silicon layer 302 manufactured in this embodiment is strongly bonded to the glass substrate 300, and there is no peeling of the silicon layer even with a tape peel test. In other words, it is possible to provide a single-crystal silicon layer over any of a variety of glass substrates that are used in the electronics industry and that are referred to as non-alkali glass substrates, such as aluminosilicate glass substrates, aluminoborosilicate glass substrates, and barium borosilicate glass substrates, and to manufacture various integrated circuits and display devices using a substrate that is longer than one meter on each side.

EMBODIMENT 2

In this embodiment, evaluation results of characteristics of an SOI substrate manufactured according to the present invention are described.

A method for manufacturing the SOI substrate evaluated in this embodiment is described below.

First, a silicon oxynitride film was formed at a thickness of 50 nm over a single-crystal silicon substrate by a plasma CVD method. In addition, a silicon nitride oxide film was formed at a thickness of 50 nm.

Then, hydrogen was added to the single-crystal silicon substrate from the surface of the silicon nitride oxide film by using an ion doping apparatus. In this embodiment, hydrogen was ionized and added to form an embrittlement layer in the single-crystal silicon substrate. The ion doping was performed with an accelerating voltage of 40 kV at a dose of $1.75\times10^{16}$ ions/cm$^2$.

Next, a silicon oxide film was formed over the silicon nitride oxide film. The silicon oxide film was formed at a thickness of 50 nm by a plasma CVD method using tetraethoxysilane (TEOS) (chemical formula: $Si(OC_2H_5)_4$) and an oxygen gas at a temperature of 300° C.

Next, the single-crystal silicon substrate and a glass substrate were superposed on each other, with the silicon oxide film interposed therebetween, to form a bond. After that, heat treatment was performed at 600° C. for 20 minutes and then at 650° C. for 7 minutes, whereby a crack was formed in the embrittlement layer to separate the single-crystal silicon substrate from the glass substrate and the bond between the silicon oxide film and the glass substrate was strengthened. Because the silicon oxide film was bonded to the glass substrate, an SOI layer having the same crystallinity as the single-crystal silicon substrate was left remaining over the glass substrate.

Figure 12:
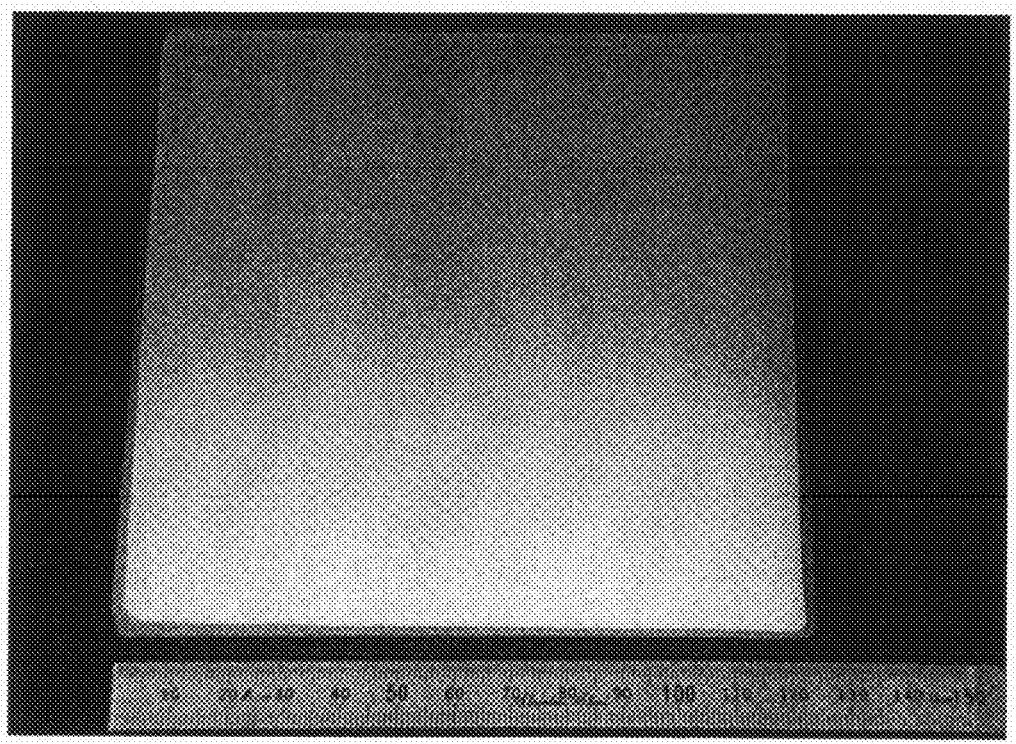
FIG. 12 is a photograph of the entire surface of an SOI layer.

FIG. 12 shows a photograph of the entire surface of the SOI layer that was obtained through the above steps.

Figure 13A:
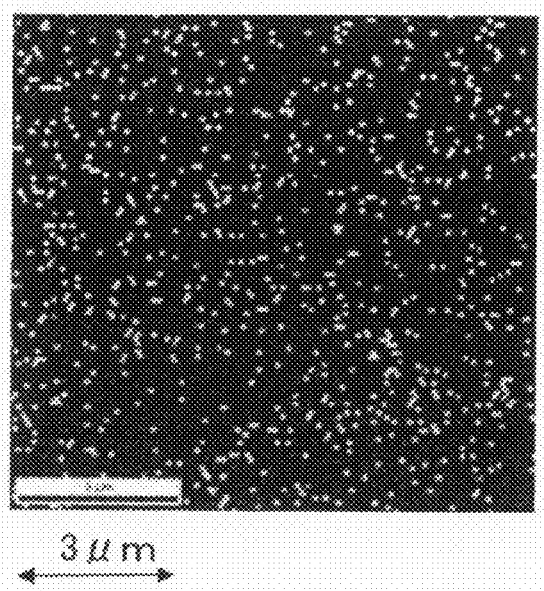
FIGS. 13A and 13B are diagrams showing results obtained from measurement data of EBSP.
Figure 13B:
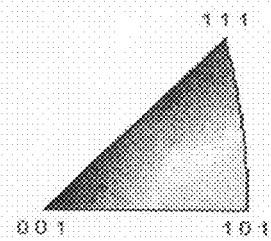

In addition, FIGS. 13A and 13B show the results obtained from measurement data of an electron backscatter diffraction pattern (EBSP) of the surface of the SOI layer that was obtained.

FIG. 13A is an inverse pole figure (IPF) map obtained from the measurement data of the EBSP of the surface of the SOI layer. FIG. 13B is a color-coded map, in which crystal orientations on respective planes are color-coded, showing the relationship between coloration of the IPF map and crystal orientation (crystal axes).

It can be seen from the IPF map of FIG. 13A that the surface of the SOI layer is oriented in (100) plane.

It can also be seen from the IPF map of FIG. 13A that there is no crystal grain boundaries in the SOI layer. This is because it is determined that crystals are oriented in (100) plane and that there is no crystal grain boundaries, based on the fact that the IPF map of FIG. 13A is a monochromatic square image of a color (red in the color image) representing the (100) plane in the color code map of FIG. 13B.

EMBODIMENT 3

In this embodiment, evaluation results of characteristics of an SOI substrate manufactured according to the present invention are described.

Note that, for the SOI substrate used as a sample for evaluation of characteristics, an embrittlement layer was formed in an ion doping step with the use of an ion doping apparatus by adding hydrogen ions to a single-crystal silicon substrate with an accelerating voltage of 80 kV at a dose of $2.0 \times 10^{16}$ ions/cm$^2$. In addition, in a step of separation of the single-crystal silicon substrate, heat treatment was performed at 400° C. for 10 minutes, at 500° C. for two hours, and then at 400° C. for two hours.

The SOI layer obtained through the above steps was evaluated by Raman spectroscopy.

In Raman spectroscopy, the peak wave number of Raman shift is a characteristic value that depends on the kind of crystal. That is, the peak wave number of Raman shift of a single crystal of a given substance is a characteristic value. Thus, the closer the peak wave number of Raman shift of a measured object is to the characteristic value, the closer the crystal structure of the measured object is to that of the single crystal of the given substance. For example, the peak wave number of Raman shift of single-crystal silicon without any internal stress is 520.6 cm$^{-1}$. The closer the peak wave number of Raman shift of a measured object is to 520.6 cm$^{-1}$, the closer the crystal structure of the measured object is to that of single-crystal silicon. Thus, the peak wave number of Raman shift can be used as an indicator for evaluating crystallinity.

In addition, a smaller full width at half maximum (FWHM) of a Raman spectrum indicates that a crystal state is more uniform with less variation. The FWHM of a commercial single-crystal silicon substrate is about 2.5 cm$^{-1}$ to 3.0 cm$^{-1}$, and a measured object having a value closer to this value can be evaluated as having a higher level of crystallinity like that of a single-crystal silicon substrate.

As a result of evaluation of the SOI layer of this embodiment by Raman spectroscopy, the peak wave number of Raman shift was found to be 519.8 cm$^{-1}$ and the FWHM of the Raman spectrum was found to be 3.77 cm$^{-1}$. This shows that the SOI layer included in the SOI substrate of this embodiment has a crystal structure close to that of single-crystal silicon without any internal stress and has a high level of crystallinity like a commercial single-crystal silicon substrate.

EMBODIMENT 4

An ion irradiation method, which is one aspect of the present invention, is considered below.

In the present invention, a single-crystal semiconductor substrate is irradiated with ions that are derived from hydrogen (H). More specifically, a hydrogen gas or a gas which contains hydrogen in its composition is used as a source material; a hydrogen plasma is generated; and a single-crystal semiconductor substrate is irradiated with the hydrogen ions in the hydrogen plasma. Note that there is a plurality of types of ions as ions that are derived from hydrogen, which is hereinafter referred to as hydrogen ion species.

(Ions in Hydrogen Plasma)

In such a hydrogen plasma as described above, hydrogen ion species such as H$^+$, H$_2^+$, and H$_3^+$ are present. Here are listed reaction equations for reaction processes (formation processes, destruction processes) of the hydrogen ion species.

 (1)

 (2)

 (3)

 (4)

 (5)

 (6)

 (7)

 (8)

 (9)

Figure 14:
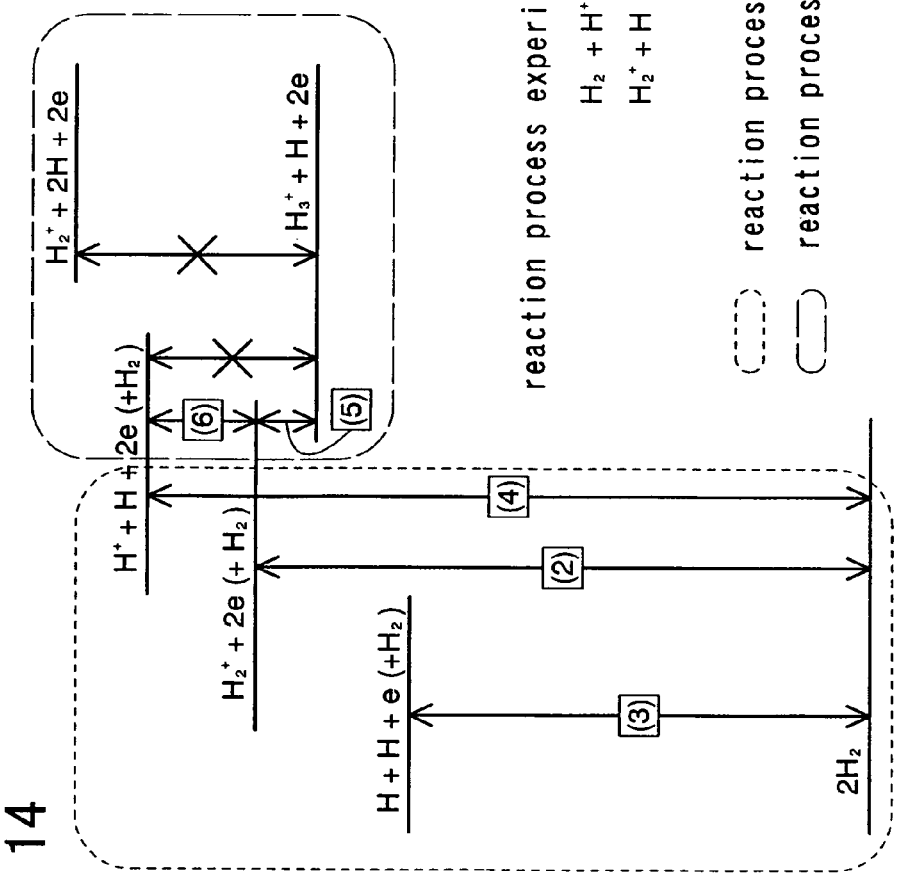
FIG. 14 is an energy diagram of hydrogen ion species.

FIG. 14 is an energy diagram which schematically shows some of the above reactions. Note that the energy diagram shown in FIG. 14 is merely a schematic diagram and does not depict the relationships of energies of the reactions exactly.

(H$_3^+$ Formation Process)

As shown above, H$_3^+$ is mainly generated through the reaction process that is represented by the reaction equation (5). On the other hand, as a reaction that competes with the reaction equation (5), there is the reaction process represented by the reaction equation (6). For the amount of H$_3^+$ to increase, at the least, it is necessary that the reaction of the reaction equation (5) occur more often than the reaction of the reaction equation (6) (note that, because there are also other reactions, (7), (8), and (9), through which the amount of H$_3^+$ is decreased, the amount of H$_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of H$_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of H$_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of H$_2^+$ is higher than about 11 eV, the reaction of the reaction equation (6) is the main reaction.

A force is exerted on a charged particle by an electric field, and the charged particle gains kinetic energy. In this case, the amount of increase in the kinetic energy corresponds to the amount of decrease in potential energy. For example, the kinetic energy a given charged particle gains before colliding with another particle is equal to a potential energy lost by transfer of the charged particle. That is, in a situation where a charged particle can transfer a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle may be high if the charged particle can gain a high amount of kinetic energy while transferring through the path. That is, it can be said that, even in the situation where the mean free path is short, the kinetic energy of a charged particle is high if the potential difference between two points in transfer pathway is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 15:
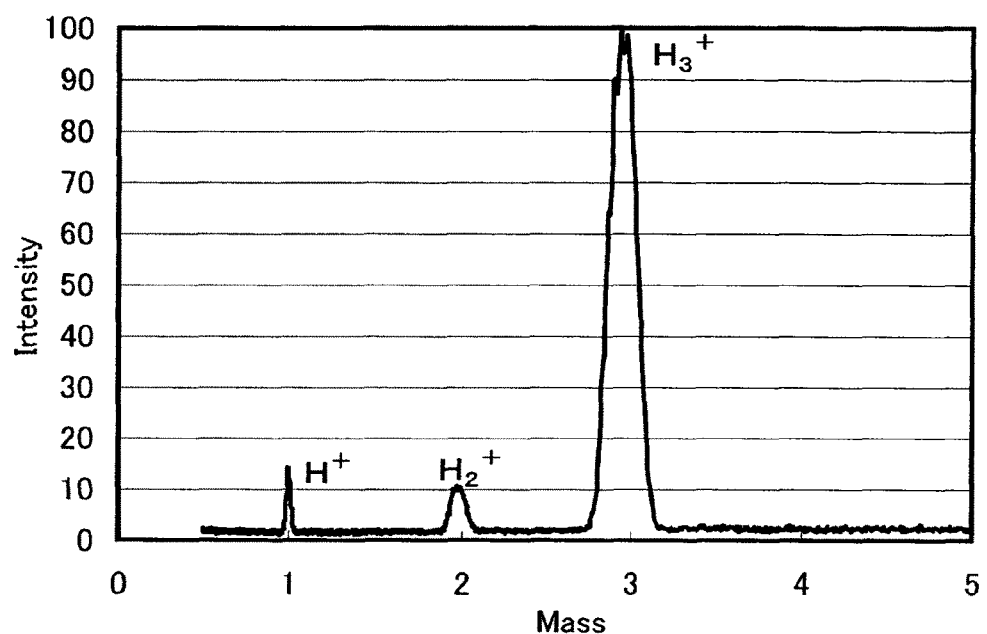
FIG. 15 is a diagram showing the results of ion mass spectrometry.

Here, an example, in which the proportions of ion species (particularly, the proportion of $H_3^+$) are different, is described. FIG. 15 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. The vertical axis represents the intensity of a spectrum corresponding to the number of ions. In the spectrum, the mass 1 peak, the mass 2 peak, and the mass 3 peak correspond to $H^+$, $H_2^+$, and $H_3^+$, respectively. In FIG. 15, the number of ions of each ion species with different masses is expressed as a relative proportion where the number of ions of the ion species with a mass of 3 is defined as 100. It can be seen from FIG. 15 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 16:
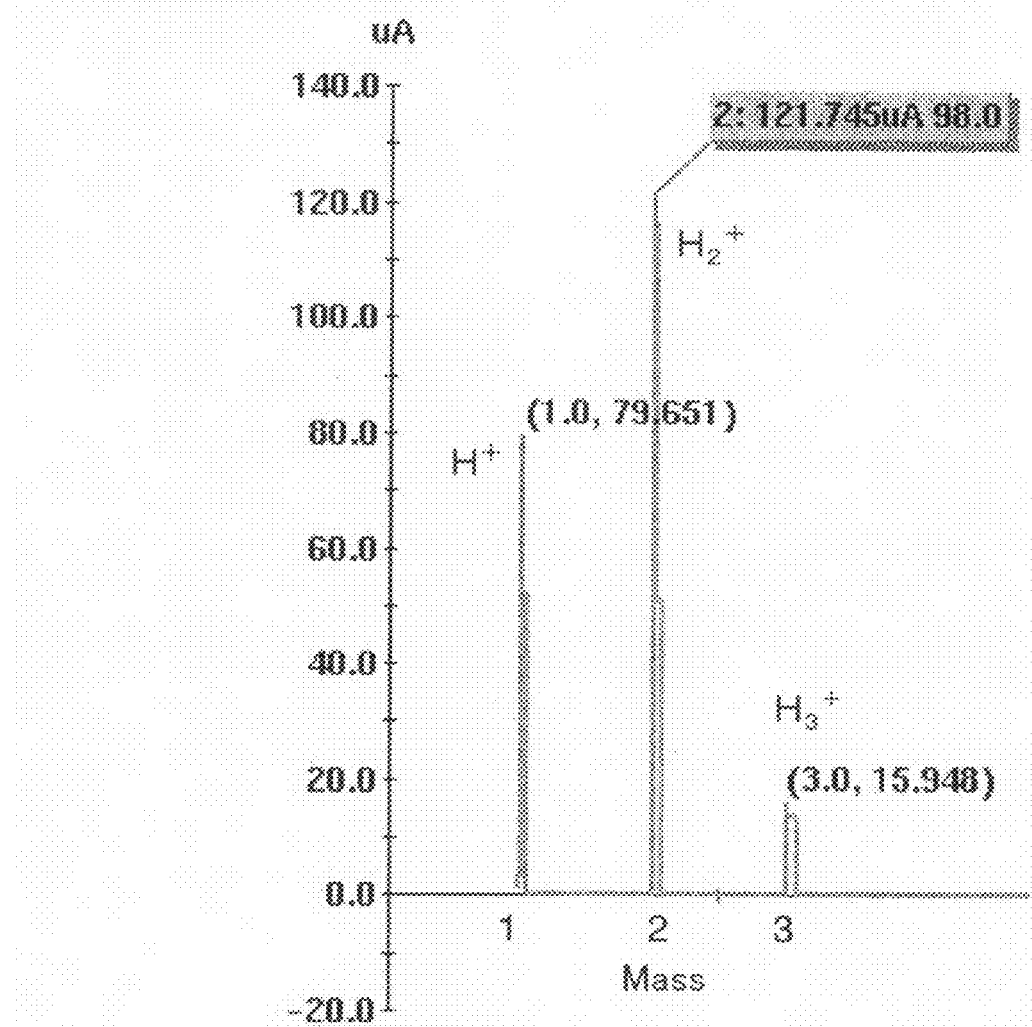
FIG. 16 is a diagram showing the results of ion mass spectrometry.

FIG. 16 is a graph showing the results of mass spectrometry of ions that are generated from $PH_3$ when an ion source different from that for the case of FIG. 15 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 15, the horizontal axis represents ion mass, and the vertical axis represents the intensity of a spectrum corresponding to the number of ions. In the spectrum, the mass 1 peak, the mass 2 peak, and the mass 3 peak correspond to $H^+$, $H_2^+$, and $H_3^+$, respectively. It can be seen from FIG. 16 that the ratio between ion species in a plasma, i.e., the ratio between $H^+$, $H_2^+$, and $H_3^+$, is about 37:56:7. Note that, although FIG. 16 shows the data obtained when the source gas is $PH_3$, the ratio between the hydrogen ion species is about the same when a 100% hydrogen gas is used as a source gas, as well.

In the case of the ion source from which the data shown in FIG. 16 is obtained, $H_3^+$, of $H^+$, $H_2^+$, and $H_3^+$, is generated at a proportion of only about 7%. On the other hand, in the case of the ion source from which the data shown in FIG. 15 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 15 is generated and a single-crystal semiconductor substrate is irradiated with the generated ion species without any mass separation being performed, the surface of the single-crystal semiconductor substrate is irradiated with each of $H^+$, $H_2^+$, and $H_3^+$ ion species. In order to reproduce the mechanism, from the ion irradiation to the formation of an embrittlement layer, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of an Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of an Si substrate changes into a non-single-crystal structure due to the collision of the hydrogen ion species with Si atoms.

Figure 17:
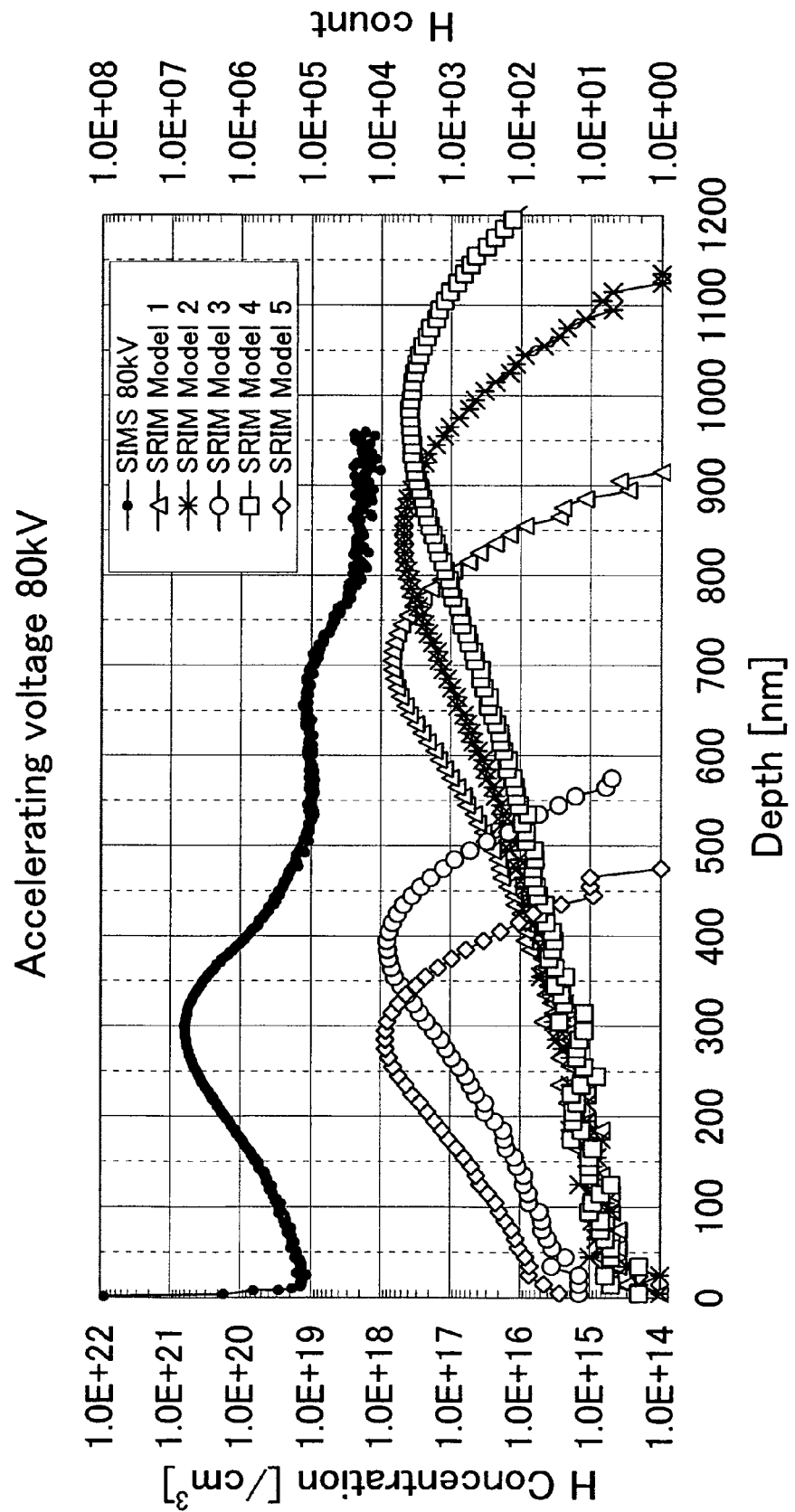
FIG. 17 is a diagram showing the profile (measured values and calculated values) of hydrogen in the depth direction when the accelerating voltage is 80 kV.

FIG. 17 shows the calculation results obtained when irradiation with the hydrogen ion species (irradiation with 100, 000 atoms for H) is performed using Models 1 to 5. FIG. 17 also shows the hydrogen concentration (secondary ion mass spectrometry (SIMS) data) in an Si substrate irradiated with the hydrogen ion species of FIG. 15. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of an Si substrate. If the SIMS data, which is measured values, is compared with the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 18:
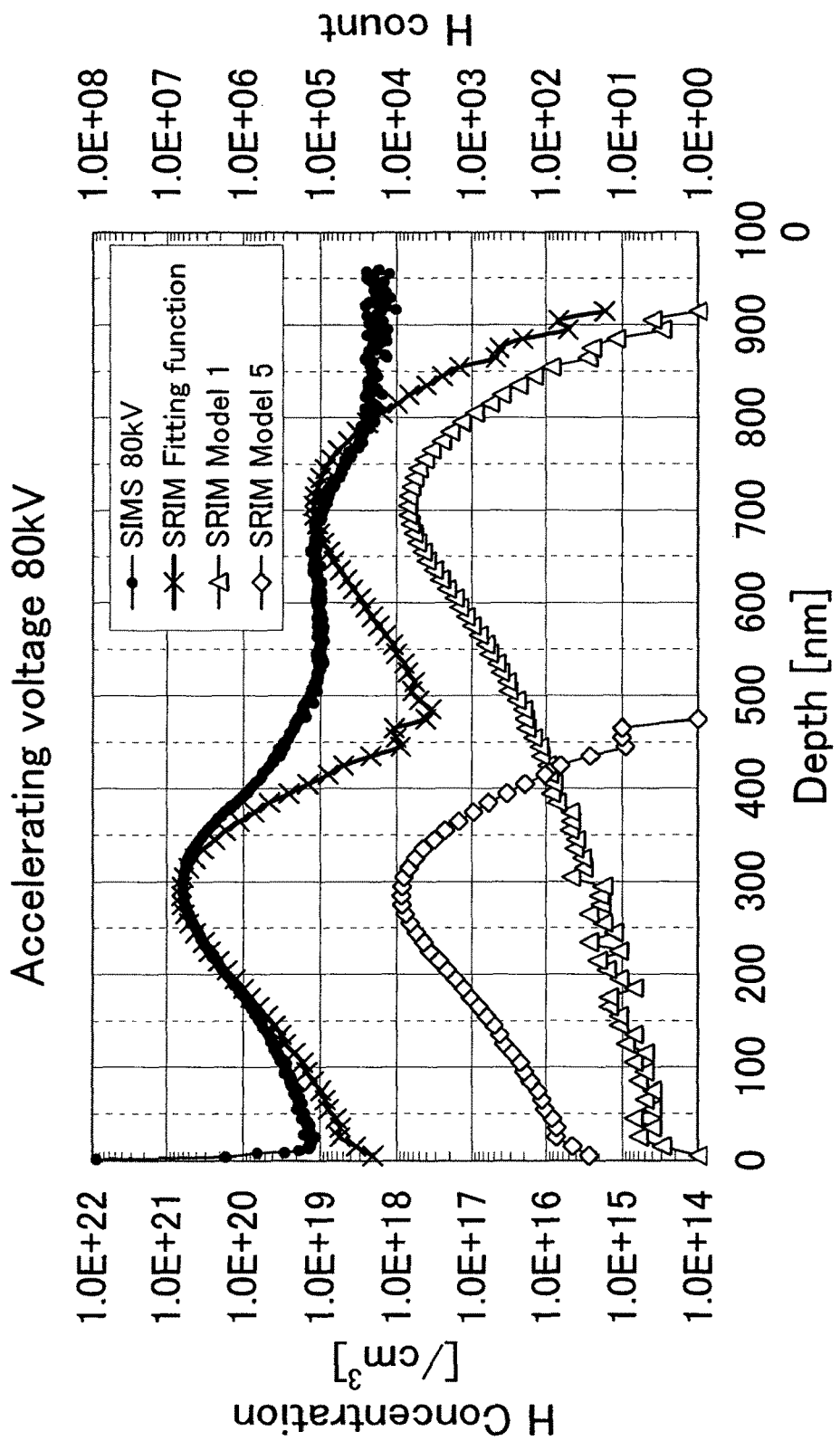
FIG. 18 is a diagram showing the profile (measured values, calculated values, and fitting functions) of hydrogen in the depth direction when the accelerating voltage is 80 kV.
Figure 19:
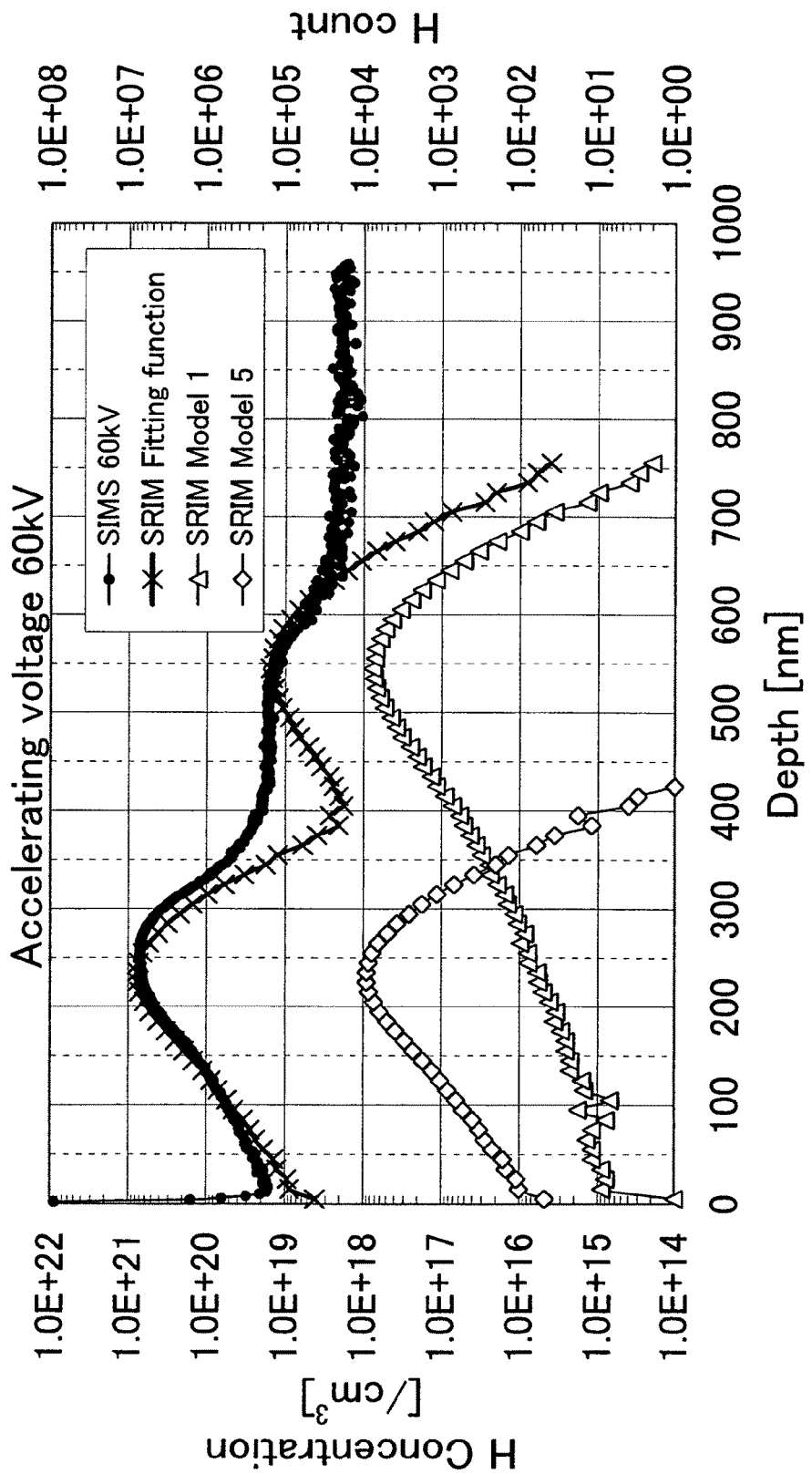
FIG. 19 is a diagram showing the profile (measured values, calculated values, and fitting functions) of hydrogen in the depth direction when the accelerating voltage is 60 kV.
Figure 20:
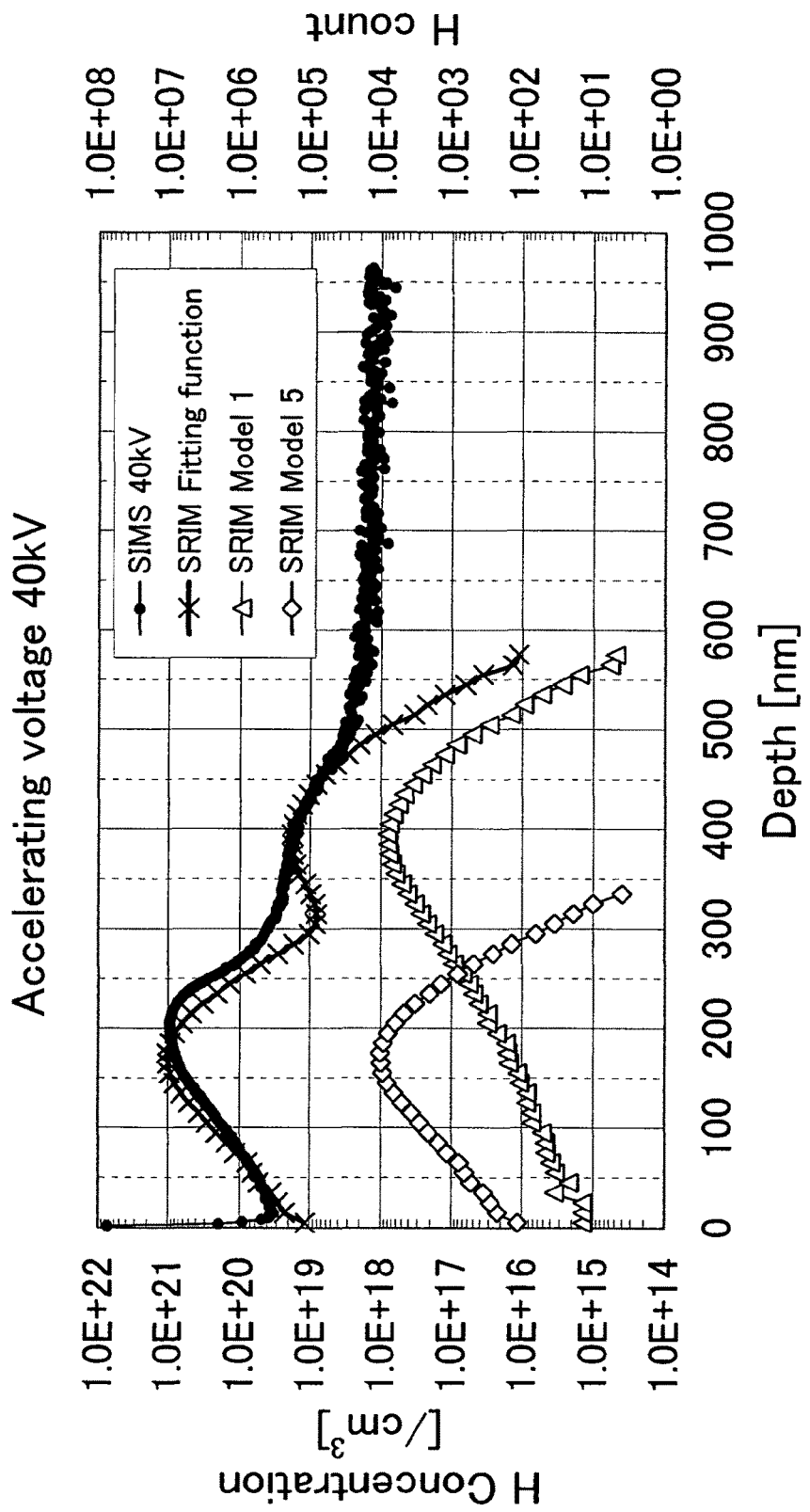
FIG. 20 is a diagram showing the profile (measured values, calculated values, and fitting functions) of hydrogen in the depth direction when the accelerating voltage is 40 kV.

Accordingly, Models 2 to 4 will not be considered hereinafter. FIGS. 18 to 20 each show the calculation results obtained when irradiation with the ions (irradiation with 100,000 atoms for H) is performed using Models 1 and 5. FIGS. 18 to 20 also each show the hydrogen concentration (SIMS data) in an Si substrate irradiated with the ions of FIG. 15, and the simulation results fitted to the SIMS data (hereinafter referred to as a fitting function). Here, FIG. 18 shows the case where the accelerating voltage is 80 kV; FIG. 19, the case where the accelerating voltage is 60 kV; and FIG. 20, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of an Si substrate.

The fitting function is obtained using the calculation formula given below, in consideration of Models 1 and 5. Note that, in the calculation formula, X and Y represent parameters for fitting and V represents volume.

(Fitting Function)=$X/V$×(Data of Model 1)+$Y/V$×(Data of Model 5)

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons. Because the amount of hydrogen added through the irradiation process represented by Model 3 is lower than that added through the irradiation process of Model 5, there is no significant influence even if Model 3 is excluded from the consideration (no peak appears in the SIMS data either). Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 21 lists the aforementioned fitting parameters. At any of the accelerating voltages, the ratio of the amount of H added according to Model 1 to that added according to Model 5 is about 1:42 to 1:45 (the amount of H in Model 5, when the amount of H in Model 1 is defined as 1, is about 42 to 45), and the ratio of the ion species used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiating a single-crystal semiconductor substrate with hydrogen ion species with a higher proportion of $H_3^+$ as shown in FIG. 15. For example, because $H_3^+$ splits into $H^+$, H, or the like to be added into the single-crystal semiconductor substrate, ion introduction efficiency can be improved compared with the case of irradiation mainly with $H^+$ or $H_2^+$. This leads to an improvement in an SOI substrate production efficiency. In addition, because the kinetic energy of $H^+$ or H after $H_3^+$ splits similarly tends to be low, $H_3^+$ is suitable for manufacture of an SOI substrate having thin semiconductor layer.

Note that, in this embodiment, a method is described in which an ion doping apparatus that is capable of irradiation with the hydrogen ion species as shown in FIG. 15 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion doping apparatus.

EMBODIMENT 5

In this embodiment, the proportion of $H_3^+$ ions in an ion doping step of the method for manufacturing an SOI substrate according to the present invention is examined.

For the SOI substrate used in this embodiment, an embrittlement layer was formed in a ion doping step with the use of an ion doping apparatus that uses a filament as a plasma discharge electrode by exciting a hydrogen gas to generate plasma through discharge at a hydrogen gas flow rate of 50 sccm, accelerating ions that were included in plasma without mass separation, and irradiating a single-crystal semiconductor substrate with the accelerated ions. The ion doping was performed with an ion current density of 5 μA/cm² and an accelerating voltage of 80 kV, at a dose of $4\times10^{15}$ ions/cm². In this embodiment, the proportion of $H_3^+$ ions to the total quantity of ion species ($H^+$ ions, $H_2^+$ ions, and $H_3^+$ ions) generated from a hydrogen gas was set to be about 80%.

For comparison, a sample (hereinafter referred to as a comparison sample), in which an embrittlement layer was formed in an ion doping step with the use of an ion doping apparatus by irradiating a single-crystal semiconductor substrate with $H_2^+$ ions obtained with an RF power of 50 W with an accelerating voltage of 80 kV at a dose of $2.0\times10^{16}$ ions/cm², was examined. The ion doping was performed with the same accelerating voltage and at the same dose as were used for the above-described SOI substrate of this embodiment.

Figure 22:
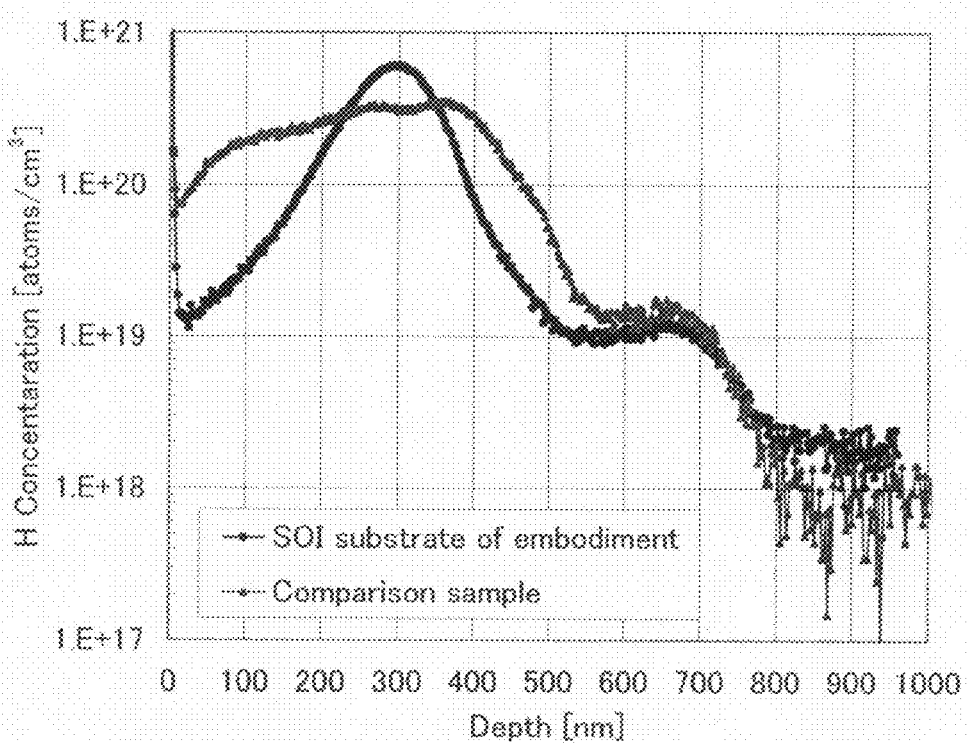
FIG. 22 is a graph showing the distribution of hydrogen concentration in the depth direction.

FIG. 22 shows the results of analyses by a secondary ion mass spectrometry method of the SOI substrate of this embodiment and the comparison sample obtained through the above steps. In FIG. 22, the horizontal axis represents depth (nm) from the substrate surface, whereas the vertical axis represents hydrogen concentration (H Concentration (atoms/cm³)).

A broader peak was observed in the hydrogen concentration distribution with respect to the depth from the surface of the semiconductor substrate of the comparison sample, compared with that of the SOI substrate of this embodiment. In the hydrogen concentration distribution of the SOI substrate of this embodiment, a sharp peak due to $H_3^+$ ions was observed at around 300 nm. This shows that the hydrogen concentration with respect to the depth from the surface of single-crystal semiconductor substrate varies less when the proportion of $H_3^+$ ions to ions used for ion doping is set to be high at about 80%.

As a result of evaluating the SOI substrate of this embodiment and the comparison sample by Raman spectroscopy, the full width at half maximum of the Raman spectrum of the SOI substrate of this embodiment was found to be 3.70 $cm^{-1}$ and that of the comparison sample was found to be 5.10 $cm^{-1}$. From the fact that the SOI substrate of this embodiment has a smaller full width at half maximum than the comparison sample, it can be seen that the SOI substrate of this embodiment has a more uniform crystal state with less variation. This shows that an SOI substrate with few crystal defects can be obtained when the proportion of $H_3^+$ ions to ions used for ion doping is set to be high at about 80% and the proportion of hydrogen ion species other than $H_3^+$ ions is set to be low.

This application is based on Japanese Patent Application serial no. 2007-097892 filed with Japan Patent Office on Apr. 3, 2007, the entire contents of which are hereby incorporated by reference.

What is claimed is:

1. A method for manufacturing an SOI substrate, comprising the steps of:
    irradiating a single-crystal semiconductor substrate with $H^+$ ions and $H_3^+$ ions to form an embrittlement layer in a region at a certain depth from a surface of the single-crystal semiconductor substrate; and
    separating a part of the single-crystal semiconductor substrate from the rest of the single-crystal semiconductor substrate along the embrittlement layer to form a single-crystal semiconductor layer over a base substrate,
    wherein a proportion of the $H_3^+$ ions is higher than a proportion of the $H^+$ ions in the irradiating step.

2. The method for manufacturing an SOI substrate according to claim 1, further comprising the step of forming a single layer of a film or a stacked layer of a plurality of films selected from the group consisting of a silicon nitride film, a silicon nitride oxide film, and a silicon oxynitride film before forming the embrittlement layer.

3. A method for manufacturing an SOI substrate, comprising the steps of:
    irradiating a single-crystal semiconductor substrate with $H^+$ ions and $H_3^+$ ions to form an embrittlement layer in a region at a certain depth from a surface of the single-crystal semiconductor substrate;
    forming a silicon oxide film over the single-crystal semiconductor substrate by a chemical vapor deposition method using an organic silane gas; and
    separating a part of the single-crystal semiconductor substrate from the rest of the single-crystal semiconductor substrate along the embrittlement layer by performing heat treatment to the single-crystal semiconductor substrate and a base substrate on each other with the silicon oxide film interposed therebetween to form a single-crystal semiconductor layer, over the base substrate,
    wherein a proportion of the $H_3^+$ ions is higher than a proportion of the $H^+$ ions in the irradiating step.

4. The method for manufacturing an SOI substrate according to claim 3, wherein the organic silane gas includes one of tetraethoxysilane (TEOS) (chemical formula: $Si(OC_2H_5)_4$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

5. The method for manufacturing an SOI substrate according to claim 3,
    wherein the formation of the silicon oxide film by a chemical vapor deposition method using the organic silane gas is performed at a temperature of 350° C. or lower, and
    wherein the heat treatment is performed at a temperature of 400° C. or higher.

6. The method for manufacturing an SOI substrate according to claim 3, further comprising the step of forming a single layer of a film or a stacked layer of a plurality of films selected from the group consisting of a silicon nitride film, a silicon nitride oxide film, and a silicon oxynitride film before forming the embrittlement layer.

7. A method for manufacturing an SOI substrate, comprising the steps of:
    irradiating a single-crystal semiconductor substrate with $H^+$ ions, $H_2^+$ ions and $H_3^+$ ions to form an embrittlement layer in a region at a certain depth from a surface of the single-crystal semiconductor substrate;
    forming a silicon oxide film over the single-crystal semiconductor substrate by a chemical vapor deposition method using an organic silane gas; and
    separating a part of the single-crystal semiconductor substrate from the rest of the single-crystal semiconductor substrate along the embrittlement layer by performing heat treatment to the single-crystal semiconductor substrate and a base substrate on each other with the silicon oxide film interposed therebetween to form a single-crystal semiconductor layer over the base substrate,
    wherein a proportion of the $H_3^+$ ions is higher than a proportion of the $H^+$ ions in the irradiating step, and
    wherein the proportion of the $H_3^+$ ions is higher than a proportion of the $H_2^+$ ions in the irradiating step.

8. The method for manufacturing an SOI substrate according to claim 7, wherein the organic silane gas includes one of tetraethoxysilane (TEOS) (chemical formula: $Si(OC_2H_5)_4$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

9. The method for manufacturing an SOI substrate according to claim 7,
    wherein the formation of the silicon oxide film by a chemical vapor deposition method using the organic silane gas is performed at a temperature of 350° C. or lower, and
    wherein the heat treatment is performed at a temperature of 400° C. or higher.

10. The method for manufacturing an SOI substrate according to claim 7, further comprising the step of forming a single layer of a film or a stacked layer of a plurality of films selected from the group consisting of a silicon nitride film, a silicon nitride oxide film, and a silicon oxynitride film before forming the embrittlement layer.

11. A method for manufacturing an SOI substrate, comprising the steps of:
    extracting $H^+$ ions, $H_2^+$ ions and $H_3^+$ ions without mass separation from a plasma generated using a single source gas and irradiating a single-crystal semiconductor substrate with the $H^+$ ions, the $H_2^+$ ions and the $H_3^+$ ions to form an embrittlement layer in a region at a certain depth from a surface of the single-crystal semiconductor substrate;

forming a silicon oxide film over the single-crystal semiconductor substrate by a chemical vapor deposition method using an organic silane gas; and separating a part of the single-crystal semiconductor substrate from the rest of the single-crystal semiconductor substrate along the embrittlement layer by performing heat treatment to the single-crystal semiconductor substrate and a base substrate on each other with the silicon oxide film interposed therebetween to form a single-crystal semiconductor layer over the base substrate, wherein a proportion of the $H_3^+$ ions is higher than a proportion of the $H^+$ ions in the irradiating step, and wherein the proportion of the $H_3^+$ ions is higher than a proportion of the $H_2^+$ ions in the irradiating step.

12. The method for manufacturing an SOI substrate according to claim 11, wherein the single source gas is hydrogen gas, helium gas or halogen gas.

13. The method for manufacturing an SOI substrate according to claim 11, wherein the organic silane gas includes one of tetraethoxysilane (TEOS) (chemical formula: $Si(OC_2H_5)_4$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

14. The method for manufacturing an SOI substrate according to claim 11,
wherein the formation of the silicon oxide film by a chemical vapor deposition method using the organic silane gas is performed at a temperature of 350° C. or lower, and
wherein the heat treatment is performed at a temperature of 400° C. or higher.

15. The method for manufacturing an SOI substrate according to claim 11, further comprising the step of forming a single layer of a film or a stacked layer of a plurality of films selected from the group consisting of a silicon nitride film, a silicon nitride oxide film, and a silicon oxynitride film before forming the embrittlement layer.

16. A method for manufacturing an SOI substrate, comprising the steps of:
irradiating a single-crystal semiconductor substrate with $H_2^+$ ions and $H_3^+$ ions to form an embrittlement layer in a region at a certain depth from a surface of the single-crystal semiconductor substrate; and separating a part of the single-crystal semiconductor substrate from the rest of the single-crystal semiconductor substrate along the embrittlement layer to form a single-crystal semiconductor layer over a base substrate, wherein a proportion of the $H_3^+$ ions is higher than a proportion of the $H_2^+$ ions in the irradiating step.

17. The method for manufacturing an SOI substrate according to claim 16, further comprising the step of forming a single layer of a film or a stacked layer of a plurality of films selected from the group consisting of a silicon nitride film, a silicon nitride oxide film, and a silicon oxynitride film before forming the embrittlement layer.

18. A method for manufacturing an SOI substrate, comprising the steps of:
irradiating a single-crystal semiconductor substrate with $H_2^+$ ions and $H_3^+$ ions to form an embrittlement layer in a region at a certain depth from a surface of the single-crystal semiconductor substrate;

forming a silicon oxide film over the single-crystal semiconductor substrate by a chemical vapor deposition method using an organic silane gas; and separating a part of the single-crystal semiconductor substrate from the rest of the single-crystal semiconductor substrate along the embrittlement layer by performing heat treatment to the single-crystal semiconductor substrate and a base substrate on each other with the silicon oxide film interposed therebetween to form a single-crystal semiconductor layer over the base substrate, wherein a proportion of the $H_3^+$ ions is higher than a proportion of the $H_2^+$ ions in the irradiating step.

19. The method for manufacturing an SOI substrate according to claim 18, wherein the organic silane gas includes one of tetraethoxysilane (TEOS) (chemical formula: $Si(OC_2H_5)_4$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino)silane (chemical formula: $SiH(N(CH_3)_2)_3$).

20. The method for manufacturing an SOI substrate according to claim 18,
wherein the formation of the silicon oxide film by a chemical vapor deposition method using the organic silane gas is performed at a temperature of 350° C. or lower, and
wherein the heat treatment is performed at a temperature of 400° C. or higher.

21. The method for manufacturing an SOI substrate according to claim 18, further comprising the step of forming a single layer of a film or a stacked layer of a plurality of films selected from the group consisting of a silicon nitride film, a silicon nitride oxide film, and a silicon oxynitride film before forming the embrittlement layer.

22. A method for manufacturing an SOI substrate, comprising the steps of:
irradiating a single-crystal semiconductor substrate with $H^+$ ions, $H_2^+$ ions and $H_3^+$ ions to form an embrittlement layer in a region at a certain depth from a surface of the single-crystal semiconductor substrate; and separating a part of the single-crystal semiconductor substrate from the rest of the single-crystal semiconductor substrate along the embrittlement layer to form a single-crystal semiconductor layer over a base substrate, wherein a proportion of the $H_3^+$ ions is higher than a proportion of the $H^+$ ions in the irradiating step, and wherein the proportion of the $H_3^+$ ions is higher than a proportion of the $H_2^+$ ions in the irradiating step.

23. The method for manufacturing an SOI substrate according to claim 22, further comprising the step of forming a single layer of a film or a stacked layer of a plurality of films selected from the group consisting of a silicon nitride film, a silicon nitride oxide film, and a silicon oxynitride film before forming the embrittlement layer.

* * * * *